United States Patent
Nosaka et al.

(10) Patent No.: US 11,243,468 B2
(45) Date of Patent: Feb. 8, 2022

(54) COMPOSITION FOR RESIST UNDERLAYER FILM FORMATION, RESIST UNDERLAYER FILM AND FORMATION METHOD THEREOF, AND PATTERNED SUBSTRATE PRODUCTION METHOD

(71) Applicant: JSR CORPORATION, Tokyo (JP)

(72) Inventors: Naoya Nosaka, Tokyo (JP); Goji Wakamatsu, Tokyo (JP); Tsubasa Abe, Tokyo (JP); Ichihiro Miura, Tokyo (JP); Kengo Ehara, Tokyo (JP); Hiroki Nakatsu, Tokyo (JP); Hiroki Nakagawa, Tokyo (JP)

(73) Assignee: JSR CORPORATION, Tokyo (JP)

( * ) Notice: Subject to any disclaimer, the term of this patent is extended or adjusted under 35 U.S.C. 154(b) by 276 days.

(21) Appl. No.: 16/564,499

(22) Filed: Sep. 9, 2019

(65) Prior Publication Data

US 2020/0012193 A1    Jan. 9, 2020

Related U.S. Application Data

(63) Continuation of application No. PCT/JP2018/009257, filed on Mar. 9, 2018.

(30) Foreign Application Priority Data

Mar. 10, 2017   (JP) .............................. JP2017-046092

(51) Int. Cl.
*G03F 7/20*      (2006.01)
*G03F 7/038*     (2006.01)
(Continued)

(52) U.S. Cl.
CPC ........... *G03F 7/0395* (2013.01); *C08G 61/04* (2013.01); *C08G 61/124* (2013.01); *G03F 7/094* (2013.01); *G03F 7/20* (2013.01)

(58) Field of Classification Search
CPC .......... G03F 7/094; G03F 7/20; G03F 7/0395; C08G 61/04; C08G 61/124
See application file for complete search history.

(56) References Cited

U.S. PATENT DOCUMENTS 4,659,648 A * 4/1987 Tise ...................... G03F 7/0755
                                                            430/18
8,865,025 B2 * 10/2014 Seshadri ................ H01B 1/127
                                                            252/500
(Continued)

FOREIGN PATENT DOCUMENTS

JP     2004-177668 A       6/2004
JP     2007-079137    *    3/2007
(Continued)

OTHER PUBLICATIONS

Shimasaki et al., "Synthesis and properties of novel C3-symmetrical 1,3,5-tris(dibenzoheterolyl)benzenes" Tetrahed. Lett., vol. 56 pp. 260-263 (2015).*
Hattori et al. "High resolution positive-working molecular resist derived from Truxene", J. Photopoly. Sci. Tech., vol. 22(5) pp. 609-614 (2009).*
Xu et al. "Synthesis, characterization, and optical properties of two-photon-absorbing octupolar molecule with s-triazine core", Opt. Mater., vol. 29 pp. 723-727 (2007).*

(Continued)

*Primary Examiner* — Martin J Angebranndt
(74) *Attorney, Agent, or Firm* — Element IP, PLC

(57) ABSTRACT

A composition for resist underlayer film formation contains: a compound having a partial structure represented by the following formula (1); and a solvent. In the formula (1): X represents a group represented by formula (i), (ii), (iii) or (iv). In the formula (i): $R^1$ and $R^2$ each independently represent a hydrogen atom, a substituted or unsubstituted monovalent aliphatic hydrocarbon group having 1 to 20 carbon atoms, or a substituted or unsubstituted aralkyl group having 7 to 20 carbon atoms provided that at least one of $R^1$ and $R^2$ represents the substituted or unsubstituted monovalent aliphatic hydrocarbon group having 1 to 20 carbon atoms or the substituted or unsubstituted aralkyl group having 7 to 20 carbon atoms; or $R^1$ and $R^2$ taken together represent a part of a ring structure having 3 to 20 ring atoms together with the carbon atom to which $R^1$ and $R^2$ bond.

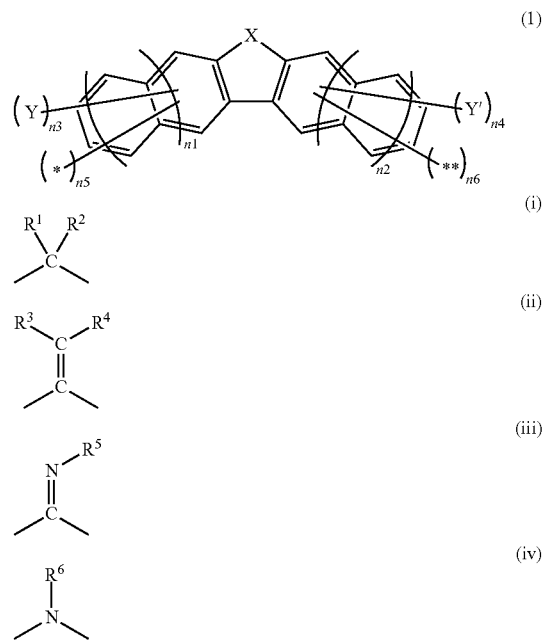

17 Claims, No Drawings

(51) Int. Cl.
*G03F 7/09* (2006.01)
*C08G 61/12* (2006.01)
*G03F 7/039* (2006.01)
*C08G 61/04* (2006.01)

(56) References Cited

U.S. PATENT DOCUMENTS

| | | | | |
|---|---|---|---|---|
| 10,577,323 B2* | 3/2020 | Okada | | C07D 405/04 |
| 11,003,079 B2* | 5/2021 | Nosaka | | C09D 165/00 |
| 2003/0064248 A1* | 4/2003 | Wolk | | H01L 51/0094 |
| | | | | 428/690 |
| 2006/0197059 A1* | 9/2006 | Kram | | H01L 51/0058 |
| | | | | 252/301.16 |
| 2012/0077345 A1* | 3/2012 | Saito | | G03F 7/094 |
| | | | | 438/703 |
| 2013/0087529 A1* | 4/2013 | Hatakeyama | | H01L 21/31144 |
| | | | | 216/47 |
| 2013/0248830 A1* | 9/2013 | Welsh | | H01L 51/0058 |
| | | | | 257/40 |
| 2014/0370444 A1* | 12/2014 | Rahman | | G03F 7/0752 |
| | | | | 430/311 |
| 2015/0118617 A1* | 4/2015 | Chen | | G03F 7/033 |
| | | | | 430/280.1 |
| 2016/0311975 A1* | 10/2016 | Lee | | C07C 323/18 |
| 2017/0018436 A1* | 1/2017 | Hatakeyama | | G03F 7/11 |
| 2017/0171156 A1* | 6/2017 | Schultz | | H04L 9/30 |
| 2017/0199457 A1* | 7/2017 | Hatakeyama | | H01L 21/32139 |
| 2017/0275223 A1* | 9/2017 | Shiota | | C08F 220/30 |

FOREIGN PATENT DOCUMENTS

| | | | |
|---|---|---|---|
| JP | 2010-271654 | * 12/2010 | |
| JP | 2010-271654 A | 12/2010 | |
| JP | WO 2010/147155 A1 | 12/2010 | |
| JP | WO 2016/147989 A1 | 9/2016 | |
| KR | 10-2010-0080137 | * 7/2010 | |
| KR | 10-2010-0080138 | * 7/2010 | |
| KR | 1020100080137 | * 7/2010 | |
| WO | 2019086402 | * 5/2019 | G03F 7/09 |

OTHER PUBLICATIONS

Lim et al., "Star-shaped hole transport materials with indeno [1,2-b]thiophene or fluorene with a triazole core for efficient perovskite solar cells", J. Mater. Chem. A,., vol. 4 pp. 1186-1190 (2016).*
Machine translation of 1020100080137 (2010).*
Machine translation of 2010-271654 (2010).*
Vasselaer et al., "Synthesis of linearly fused benzodipyrrole based organic materials", Molecules vol. 21 article 21060785 (38 pages) (2016).*
International Search Report dated May 22, 2018 in PCT/JP2018/009257 (with English translation), citing documents AL, AM, and AN therein, 5 pages.
Written Opinion of the International Search Authority dated May 22, 2018 in PCT/JP2018/009257 (with English translation), citing documents AL, AM, and AN therein, 9 pages.
Guo, Q.-S., et al., "A facile synthesis of 3 or 3,3'-substituted binaphthols and their applications in the asymmetric addition of diethylzinc to aldehydes", Journal of Organometallic Chemistry, vol. 691, 2006, pp. 1282-1287.
Badar, Y., et al., "Optical Activity in the 1,1'-Binaphthyl Series. Optically Active 8, 8'-Dimethyl-1,1'-binaphthyl", Journal of the Chemical Society, 1965, pp. 1412-1418.
Hsieh, J.-C., et al., "O-Dihaloarenes as aryne precursors for nickel-catalyzed [2+2+2] cycloaddition with alkynes and nitriles", Chemical Communications, 2008, pp. 2992-2994.
Bacon, R.G.R., et al., "Cyclisations with hydrazine. Part III.[1] Syntheses of Pentaphene and Dinaphtho[2,1-d: 1 ',2'-f][1 ,2] diazocine.", Journal of the Chemical Society, 1963, pp. 839-845.
Mizoguchi, K., et al., "Negative-Working Photosensitive Poly(phenylene ether) Based on Poly (2,6-dimethyl-1, 4-pheylene ether), a Cross-Linker, and a Photoacid Generator", Macromolecules, vol. 43, 2010, pp. 2832-2839.
Mizoguchi, K., et al., "Direct Patterning of Poly(ether ether sulfone) Using a Cross-linker and a Photoacid Generator", Polymer Journal, vol. 40 No. 7, 2008, pp. 645-650.
Mizoguchi, K., et al., "Negative-Type Photosensitive Poly(phenylene ether) Based on Poly(2, 6-dimethyl-1,4-phenylene ether), a Crosslinker, and a Photoacid Generator", Journal of Polymer Science: Part A, Polymer Chemistry, vol. 46, 2008, pp. 4949-4958.
Office Action dated Aug. 31, 2021 in Japanese Patent Application No. 2019-503871 (with English translation), 6 pages.

* cited by examiner

COMPOSITION FOR RESIST UNDERLAYER FILM FORMATION, RESIST UNDERLAYER FILM AND FORMATION METHOD THEREOF, AND PATTERNED SUBSTRATE PRODUCTION METHOD

CROSS-REFERENCE TO RELATED APPLICATIONS

The present application is a continuation application of International Application No. PCT/JP2018/009257, filed Mar. 9, 2018, which claims priority to Japanese Patent Application No. 2017-046092, filed Mar. 10, 2017. The contents of these applications are incorporated herein by reference in their entirety.

BACKGROUND OF THE INVENTION

Field of the Invention

The present invention relates to a composition for resist underlayer film formation, a resist underlayer film and a formation method thereof, and a patterned substrate production method.

Description of the Related Art

In manufacturing semiconductor devices, multilayer resist processes have been employed for attaining a high degree of integration. In these processes, first, a composition for resist underlayer film formation is applied to the upper face side of a substrate to provide a coating film which is then heated to provide a resist underlayer film, and a resist pattern is formed on the upper face side of the resist underlayer film by using a resist composition, etc. Subsequently, the resist underlayer film is etched using the resist pattern as a mask, and further the substrate is etched using the resulting resist underlayer film pattern as a mask to form a desired pattern on the substrate, thereby enabling a patterned substrate to be obtained. Resist underlayer films used in such multilayer resist processes are required to have general characteristics such as solvent resistance and etching resistance.

Moreover, the multilayer resist processes involving a procedure of forming a hard mask as an intermediate layer on the resist underlayer film has been studied recently. Specifically, since an inorganic hard mask is formed on a resist underlayer film using a CVD technique according to this procedure, particularly in a case where a nitride inorganic hard mask is formed, the temperature is elevated to be as high as at least 300° C., and typically no less than 400° C., and thus, the resist underlayer film is required to have superior heat resistance.

Still further, patterns are more frequently formed recently on a substrate having a plurality of types of trenches, in particular trenches having aspect ratios that differ from each other. In this case, the composition for resist underlayer film formation is desired to sufficiently fill these trenches and to provide superior flatness.

To meet these demands, structures of polymer, etc., contained in the composition for resist underlayer film formation, and functional groups included in the compounds have been extensively investigated (see Japanese Unexamined Patent Application, Publication No. 2004-177668).

SUMMARY OF THE INVENTION

According to an aspect of the present invention, a composition for resist underlayer film formation includes: a compound comprising a partial structure represented by formula (1); and a solvent.

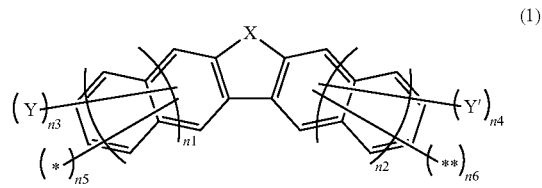

(1)

In the formula (1): X represents a group represented by formula (i), (ii), (iii) or (iv); n1 and n2 are each independently an integer of 0 to 2; Y and Y' each independently represent a monovalent organic group having 1 to 20 carbon atoms; n3 and n4 are each independently an integer of 0 to 8; * and ** each denote a bonding site to a part other than the partial structure represented by the formula (1) in the compound; and n5 and n6 are each independently an integer of 0 to 8. In a case in which n3 is no less than 2, a plurality of Ys are identical or different, and in a case in which n4 is no less than 2, a plurality of Y's are identical or different. n3+n5 is no greater than 8, n4+n6 is no greater than 8, and n5+n6 is no less than 1.

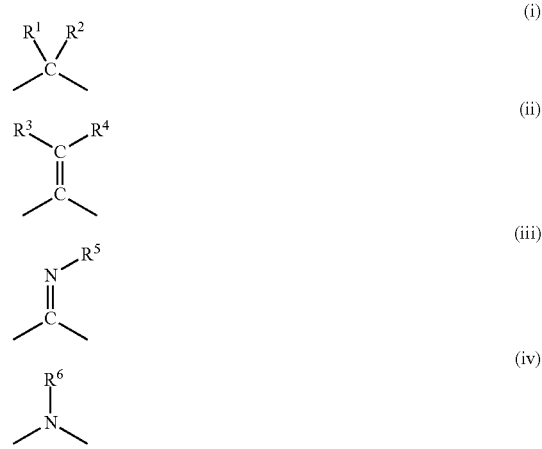

In the formula (i): $R^1$ and $R^2$ each independently represent a hydrogen atom, a hydroxy group, a substituted or unsubstituted monovalent aliphatic hydrocarbon group having 1 to 20 carbon atoms, or a substituted or unsubstituted aralkyl group having 7 to 20 carbon atoms provided that at least one of $R^1$ and $R^2$ represents the substituted or unsubstituted monovalent aliphatic hydrocarbon group having 1 to 20 carbon atoms or the substituted or unsubstituted aralkyl group having 7 to 20 carbon atoms; or $R^1$ and $R^2$ taken together represent a part of a ring structure having 3 to 20 ring atoms together with the carbon atom to which $R^1$ and $R^2$ bond. In the formula (ii): $R^3$ and $R^4$ each independently represent a hydrogen atom, a hydroxy group or a monovalent organic group having 1 to 20 carbon atoms; or $R^3$ and $R^4$ taken together represent a part of a ring structure having 3 to 20 ring atoms together with the carbon atom to which $R^3$ and $R^4$ bond. In the formula (iii), $R^5$ represents a hydrogen atom, a hydroxy group or a monovalent organic group having 1 to 20 carbon atoms. In the formula (iv), $R^6$ represents a substituted or unsubstituted monovalent aliphatic hydrocarbon group, or a substituted or unsubstituted aralkyl group having 7 to 20 carbon atoms.

According to another aspect of the present invention, a resist underlayer film is formed from the composition for resist underlayer film formation.

According to further aspect of the present invention, a resist underlayer film formation method includes: applying the composition for resist underlayer film formation directly or indirectly on an upper face side of a substrate to obtain a coating film; and heating the coating film.

According to further aspect of the present invention, a patterned substrate production method includes: forming a resist pattern on an upper face side of the resist underlayer film obtained by the resist underlayer film formation method; and carrying out etching using the resist pattern as a mask.

DESCRIPTION OF EMBODIMENTS

According to an embodiment of the invention, a composition for resist underlayer film formation contains: a compound (hereinafter, may be also referred to as "(A) compound" or "compound (A)") having a partial structure represented by the following formula (1); and a solvent (hereinafter, may be also referred to as "(B) solvent" or "solvent (B)"),

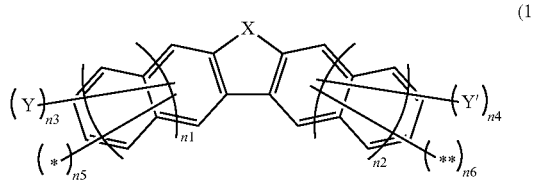

(1)

wherein, in the formula (1):

X represents a group represented by formula (i), (ii), (iii) or (iv); n1 and n2 are each independently an integer of 0 to 2; Y and Y' each independently represent a monovalent organic group having 1 to 20 carbon atoms; n3 and n4 are each independently an integer of 0 to 8; * and ** each denote a bonding site to a part other than the partial structure represented by the formula (1) in the compound; and n5 and n6 are each independently an integer of 0 to 8, wherein in a case in which n3 is no less than 2, a plurality of Ys are identical or different, and in a case in which n4 is no less than 2, a plurality of Y's are identical or different, and wherein n3+n5 is no greater than 8, n4+n6 is no greater than 8, and n5+n6 is no less than 1,

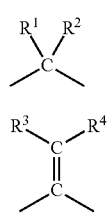

(i)

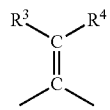

(ii)

-continued

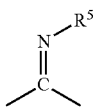

(iii)

(iv)

wherein, in the formula (i): $R^1$ and $R^2$ each independently represent a hydrogen atom, a hydroxy group, a substituted or unsubstituted monovalent aliphatic hydrocarbon group having 1 to 20 carbon atoms, or a substituted or unsubstituted aralkyl group having 7 to 20 carbon atoms; or $R^1$ and $R^2$ taken together represent a part of a ring structure having 3 to 20 ring atoms together with the carbon atom to which $R^1$ and $R^2$ bond, except for a case in which $R^1$ and $R^2$ each represent a hydrogen atom, a hydroxy group or a combination thereof, in the formula (ii): $R^3$ and $R^4$ each independently represent a hydrogen atom, a hydroxy group or a monovalent organic group having 1 to 20 carbon atoms; or $R^3$ and $R^4$ taken together represent a part of a ring structure having 3 to 20 ring atoms together with the carbon atom to which $R^3$ and $R^4$ bond, in the formula (iii), $R^5$ represents a hydrogen atom, a hydroxy group or a monovalent organic group having 1 to 20 carbon atoms, and in the formula (iv), $R^6$ represents a substituted or unsubstituted monovalent aliphatic hydrocarbon group, or a substituted or unsubstituted aralkyl group having 7 to 20 carbon atoms.

According to another embodiment of the invention, a resist underlayer film is formed from the composition for resist underlayer film formation according to the above embodiment of the present invention.

According to still another embodiment of the invention, a resist underlayer film formation method comprises: applying the composition for resist underlayer film formation according to the embodiment directly or indirectly on an upper face side of a substrate; and heating a coating film obtained after the applying.

According to yet another embodiment of the invention, a patterned substrate production method comprises: forming a resist pattern on an upper face side of the resist underlayer film obtained by the resist underlayer film formation method according to claim 8; and carrying out etching using the resist pattern as a mask.

The composition for resist underlayer film formation according to the embodiment of the present invention is capable of forming a resist underlayer film that is superior in flatness, solvent resistance, heat resistance and etching resistance. The resist underlayer film according to the another embodiment of the present invention is superior in flatness, solvent resistance, heat resistance and etching resistance. The formation method according to the still another embodiment of the present invention enables formation of a resist underlayer film superior in flatness. The patterned substrate production method according to the yet another embodiment of the present invention enables a substrate having a superior pattern configuration to be obtained using the superior resist underlayer film formed as described above. Therefore, these can be suitably used in manufacture of semiconductor devices, and the like in which further progress of miniaturization is expected in the future.

Composition for Resist Underlayer Film Formation

The composition for resist underlayer film formation according to an embodiment of the present invention contains the compound (A) and the solvent (B). The composition for resist underlayer film formation may contain an acid generating agent (hereinafter, may be also referred to as "acid generating agent (C)") and/or a crosslinkable compound (hereinafter, may be also referred to as "crosslinkable compound (D)") as favorable components, and may contain other optional component within a range not leading to impairment of the effects of the present invention. Hereinafter, each component is explained.

(A) Compound

The compound (A) has a partial structure represented by the formula (1).

Due to containing the compound (A), the composition for resist underlayer film formation enables a film that is superior in flatness, solvent resistance, heat resistance, and etching resistance to be formed. Although not necessarily clarified, the reason for the composition for resist underlayer film formation achieving the aforementioned effects due to the constitution described above is inferred as in the following, for example. Specifically, since an aromatic ring is not directly bonded to X in the formula (1), the compound (A) is superior in solubility in an organic solvent such as propylene glycol monomethyl ether acetate, and therefore superior in coating characteristics, even with the structure without a polar group. Consequently, heat resistance and etching resistance of the resist underlayer film are believed to be improved while flatness of the composition for resist underlayer film formation is improved. Furthermore, due to the compound (A) having a large number of aromatic rings and a high content of carbon atoms, solvent resistance, heat resistance and etching resistance of the resist underlayer film to be formed are believed to be improved.

In the formula (1), n1 and n2 are each preferably 0 or 1, and more preferably 0.

The monovalent organic group having 1 to 20 carbon atoms which may be represented by Y or Y' is exemplified by: a monovalent hydrocarbon group having 1 to 20 carbon atoms; a group (a) derived from this hydrocarbon group by including a divalent hetero atom-containing group between two adjacent carbon atoms; a group derived from the hydrocarbon group and the group (a) by substituting a part or all of hydrogen atoms included therein with a monovalent hetero atom-containing group; and the like.

Examples of the monovalent hydrocarbon group having 1 to 20 carbon atoms include:

chain hydrocarbon groups e.g.

alkyl groups such as a methyl group, an ethyl group, a propyl group, a butyl group and a pentyl group, alkenyl groups such as an ethenyl group, a propenyl group and a butenyl group, and alkynyl groups such as an ethynyl group, a propynyl group and a butynyl group;

alicyclic hydrocarbon groups e.g.

cycloalkyl groups such as a cyclopentyl group and a cyclohexyl group, cycloalkenyl groups such as a cyclopropenyl group, a cyclopentenyl group and a cyclohexenyl group, bridged cyclic hydrocarbon groups such as a norbornyl group and an adamantyl group;

aromatic hydrocarbon groups e.g.

aryl groups such as a phenyl group, a tolyl group, a xylyl group and a naphthyl group, and aralkyl groups such as a benzyl group, a phenethyl group and a naphthylmethyl group;

and the like.

Examples of the divalent hetero atom-containing group include —CO—, —CS—, —NH—, —O—, —S—, groups obtained by combining the same, and the like.

Examples of the group (a) derived from the hydrocarbon group by including a divalent hetero atom-containing group between two adjacent carbon atoms include aromatic heterocyclic groups, e.g.:

hetero atom-containing groups such as an oxoalkyl group, a thioalkyl group, an alkylaminoalkyl group, an alkoxyalkyl group and alkylthioalkyl group;

aliphatic heterocyclic groups such as an oxocycloalkyl group, a thiocycloalkyl group, an azacycloalkyl group, an oxacycloalkyl group, a thiacycloalkyl group, an oxocycloalkyl group and an oxathiacycloalkyl group;

heteroaryl groups such as a pyrrolyl group, a pyridyl group, a quinolyl group, an isoquinolyl group, a furyl group, a pyranyl group, a thienyl group and a benzothiophenyl group; and the like.

Examples of the monovalent hetero atom-containing group include a hydroxy group, a sulfanyl group, a cyano group, a nitro group, a halogen atom, and the like.

Y and Y' each represent preferably an alkyl group, and more preferably a methyl group.

n3 and n4 are each preferably 0 to 3, more preferably 0 to 2, still more preferably 0 or 1, and particularly preferably 0.

n5 and n6 are each preferably 1 to 6, more preferably 1 to 4. The compound (A) is exemplified by a compound represented by the following formula (1-1), in which n5 is 4, n6 is 0, n1 is 0, n3 is 0 in the partial structure represented by the above formula (1). The compound (1-1) can be readily synthesized. When the compound (1-1) is used as the compound (A), the heat resistance and the etching resistance of the resist underlayer film can be further improved.

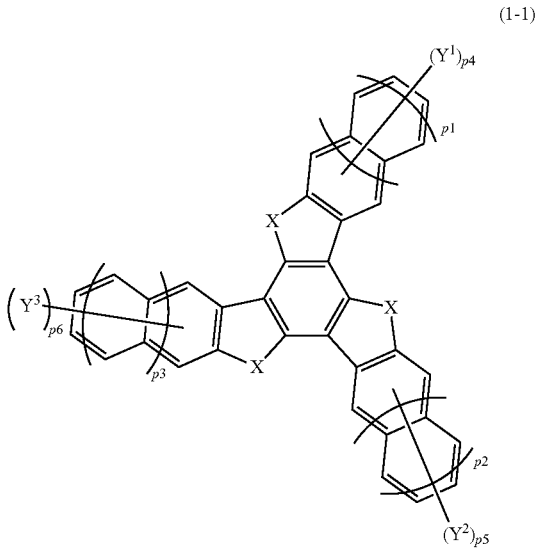

(1-1)

In the above formula (1-1), X is as defined in the above formula (1). $Y^1$, $Y^2$ and $Y^3$ are identical to Y' defined in the above formula (1). p1, p2 and p3 are identical to n2 defined in the above formula (1). p4, p5 and p6 are identical to n4 defined in the above formula (1).

The unsubstituted monovalent aliphatic hydrocarbon group having 1 to 20 carbon atoms that may be represented by $R^1$, $R^2$ or $R^6$ is exemplified by:

chain hydrocarbon groups e.g.

alkyl groups such as a methyl group, an ethyl group, a propyl group, a butyl group and a pentyl group, alkenyl groups such as an ethenyl group, a propenyl group and a butenyl group, and alkynyl groups such as an ethynyl group, a propynyl group and a butynyl group;

alicyclic hydrocarbon groups e.g.

cycloalkyl groups such as a cyclopentyl group and a cyclohexyl group, cycloalkenyl groups such as a cyclopropenyl group, a cyclopentenyl group and a cyclohexenyl group, and bridged cyclic hydrocarbon groups such as a norbornyl group and an adamantyl group;

and the like.

A substituent for the aliphatic hydrocarbon group in $R^1$, $R^2$ and $R^6$ is exemplified by: alkoxy groups such as a methoxy group and an ethoxy group; cyano groups; and the like.

The unsubstituted aralkyl group having 7 to 20 carbon atoms that may be represented by $R^1$, $R^2$ or $R^6$ is exemplified by a benzyl group, an o-methylbenzyl group, a m-methylbenzyl group, a p-methylbenzyl group, a naphthylmethyl group, an α-phenethyl group, and the like. A substituent for the aralkyl group in $R^1$, $R^2$ and $R^6$ is exemplified by: halogen atoms such as a fluorine atom and a chlorine atom; a nitro group; and the like.

$R^1$ represents preferably a hydrogen atom, a substituted or unsubstituted monovalent aliphatic hydrocarbon group having 1 to 20 carbon atoms or a substituted or unsubstituted aralkyl group having 7 to 20 carbon atoms, more preferably an unsubstituted aliphatic hydrocarbon group or an unsubstituted aralkyl group, still more preferably an aralkyl group, yet more preferably an unsubstituted chain hydrocarbon group, and particularly preferably an alkynyl group or an alkenyl group.

$R^2$ represents preferably an unsubstituted aliphatic hydrocarbon group having 1 to 20 carbon atoms or an unsubstituted aralkyl group having 7 to 20 carbon atoms, more preferably an unsubstituted chain hydrocarbon group, and still more preferably an alkynyl group or an alkenyl group.

$R^6$ represents preferably an unsubstituted aliphatic hydrocarbon group having 1 to 20 carbon atoms or an unsubstituted aralkyl group having 7 to 20 carbon atoms, more preferably an unsubstituted chain hydrocarbon group, and still more preferably an alkyl group.

The monovalent organic group having 1 to 20 carbon atoms which may be represented by $R^3$, $R^4$, or $R^5$ is exemplified by groups similar to those exemplified in connection with Y and Y' in the above formula (1), and the like.

$R^3$ represents preferably a monovalent organic group having 1 to 20 carbon atoms, more preferably a substituted or unsubstituted monovalent hydrocarbon group having 1 to 20 carbon atoms, still more preferably a substituted or unsubstituted aryl group having 6 to 20 carbon atoms, and particularly preferably a naphthyl group, a pyrenyl group, a phenanthrenyl group, an acetal group-substituted phenyl group, a hydroxy group-substituted phenyl group, a dialkylamino group-substituted phenyl group, an alkynyl group-substituted phenyl group or a N-alkyl group-substituted carbazolyl group.

$R^4$ represents preferably a hydrogen atom or a monovalent organic group having 1 to 20 carbon atoms, and more preferably a hydrogen atom.

$R^5$ represents preferably a hydroxy group or a monovalent organic group having 1 to 20 carbon atoms, more preferably an unsubstituted monovalent hydrocarbon group having 1 to 20 carbon atoms, and still more preferably an alkyl group or an aryl group.

The ring structure having 3 to 20 ring atoms taken together represented by $R^1$ and $R^2$, or $R^3$ and $R^4$ together with the carbon atom to which $R^1$ and $R^2$, or $R^3$ and $R^4$ bond is exemplified by: alicyclic structures such as a cyclohexane structure and a cyclohexene structure; aliphatic hetero ring structures such as an azacyclohexane structure and an azacyclohexene structure; and the like.

X represents preferably a group represented by the above formula (i), (ii) or (iv).

The compound (A) is exemplified by compounds represented by the following formula (2) (hereinafter, may be also referred to as a "compound (2)"), and the like. When the compound (2) is used as the compound (A), the heat resistance and the etching resistance of the resist underlayer film can be further improved.

(2)

In the above formula (2), Z represents a partial structure represented by the above formula (1) in the case in which n5 is 1 and n6 is 0, or n5 is 0 and n6 is 1. $R^4$ represents an organic group having a valency of m having 1 to 30 carbon atoms. m is an integer of 1 to 20. In a case in which m is no less than 2, a plurality of Zs are identical or different.

The organic group having a valency of m having 1 to 30 carbon atoms represented by $R^A$ is exemplified by groups obtained by removing (m-1) hydrogen atoms from those exemplified in connection with the monovalent organic group which may be represented by Y or Y' in the above formula (1), and the like.

In light of ease in synthesis, $R^A$ in the above formula (2) represents preferably a group derived from a substituted or unsubstituted arene having 6 to 20 carbon atoms or a substituted or unsubstituted heteroarene having 5 to 20 ring atoms. In other words, the compound (A) is preferably a compound represented by the following formula (2-1).

(2-1)

In the above formula (2-1), Z represents a partial structure represented by the above formula (1) in the case in which n5 is 1 and n6 is 0, or n5 is 0 and n6 is 1. $R^B$ represents a group obtained by removing m hydrogen atoms from a substituted or unsubstituted arene having 6 to 20 carbon atoms or a substituted or unsubstituted heteroarene having 5 to 20 ring atoms. m is an integer of 1 to 20, In a case in which m is no less than 2, a plurality of Zs are identical or different.

The unsubstituted arene having 6 to 20 carbon atoms that gives $R^A$ is exemplified by benzene, naphthalene, anthracene, phenanthrene, tetracene, pyrene, triphenylene, perylene and the like. Of these, benzene and naphthalene are preferred, and benzene is more preferred. The unsubstituted heteroarene having 5 to 20 ring atoms that gives $R^A$ is exemplified by pyridine, pyrazine, pyrimidine, pyridazine, triazine, quinoline, isoquinoline, quinazoline, cinnoline, phthalazine, quinoxaline, pyrrole, indole, furan, benzofuran, thiophene, benzothiophene, pyrazole, imidazole, benzimidazole, triazole, oxazole, benzoxazole, thiazole, benzothiazole, isothiazole, benzisothiazole, thiadiazole, isoxazole, benzisoxazole, and the like. Of these, triazine is preferred.

The lower limit of m is preferably 2, and more preferably 3. The upper limit of m is preferably 12, more preferably 8, and still more preferably 6. When m falls within the above range, the heat resistance and the etching resistance of the resist underlayer film can be more improved.

When $R^A$ is a 1,3,5-benzenetriyl group obtained by removing hydrogen atoms at the positions 1, 3 and 5 from benzene, symmetry of the compound (A) is further increased, whereby the flatness of the composition for resist underlayer film formation can be more improved.

The compound (A) preferably has an aromatic carbocyclic ring or an aromatic heterocyclic ring in a part other than the partial structure represented by the above formula (1), and more preferably has the partial structure represented by the above formula (1) bonded to the aromatic carbocyclic ring or the aromatic heterocyclic ring. Preferably, the aromatic carbocyclic ring and the aromatic heterocyclic ring are each a benzene ring or a triazine ring. More preferably, the benzene ring has the partial structure represented by the above formula (1) in the case in which n5 is 1 and n6 is 0, or n5 is 0 and n6 is 1 being bonded to the positions 1, 3 and 5, or the triazine ring has the partial structure represented by the above formula (1) in the case in which n5 is 1 and n6 is 0, or n5 is 0 and n6 is 1 being bonded to the positions 2, 4 and 6. The compound (A) having such a constitution may be readily synthesized from a corresponding acetyl group-containing fluorene compound or a corresponding cyano group-containing fluorene compound. In addition, such a compound is further superior in symmetry and enables the flatness to be more improved.

The compound (A) is exemplified by compounds represented by the following formulae and the like.

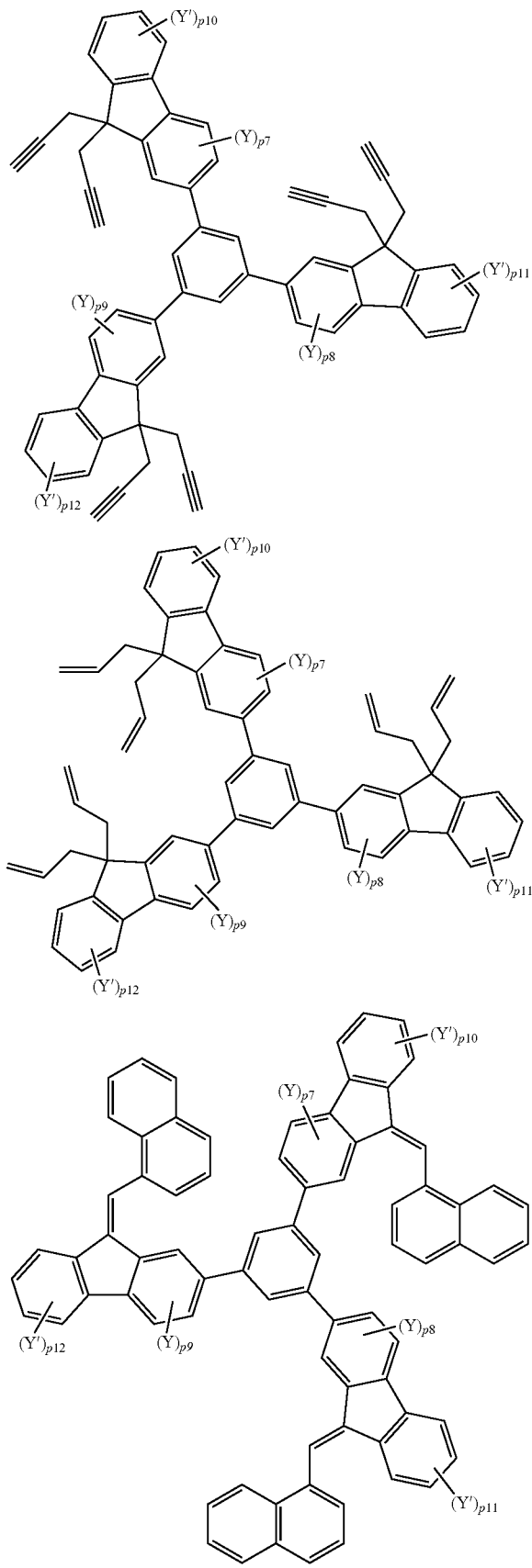

-continued
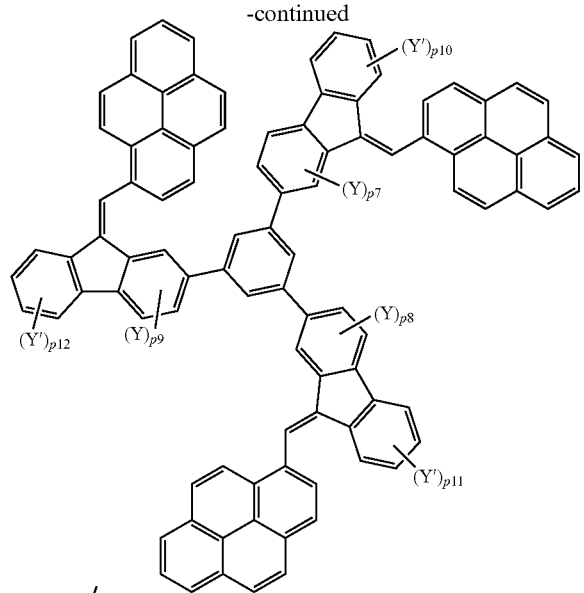
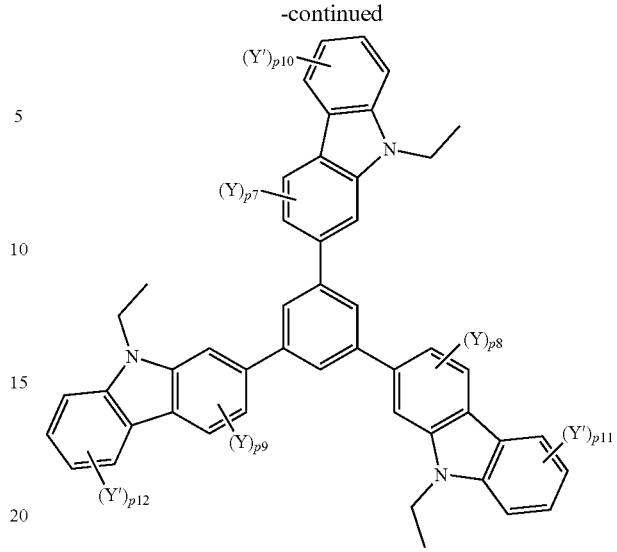
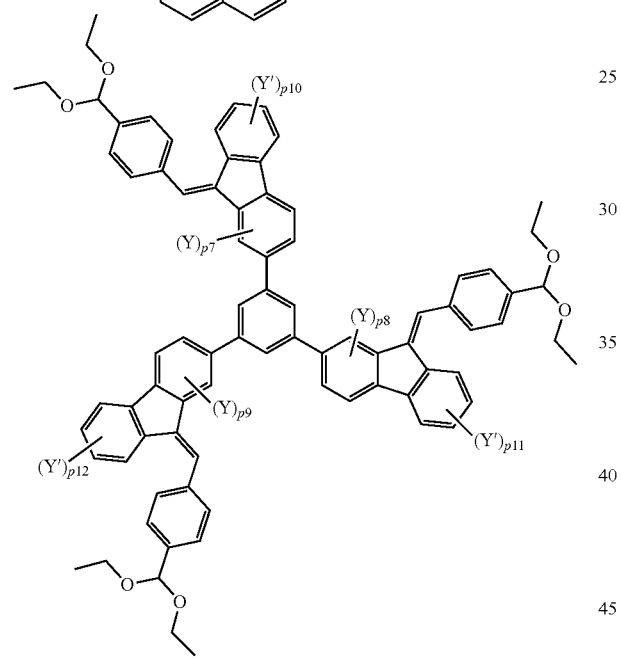
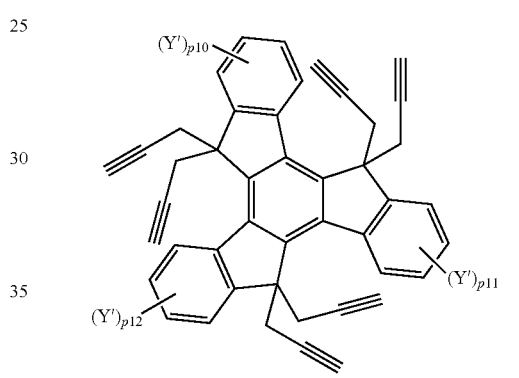
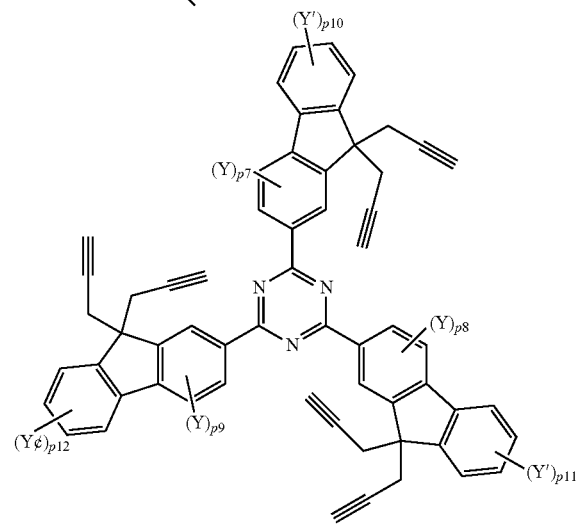
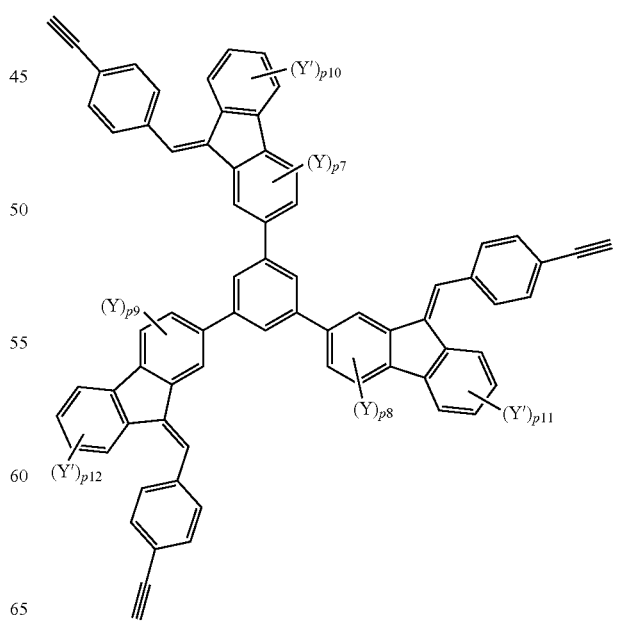

-continued

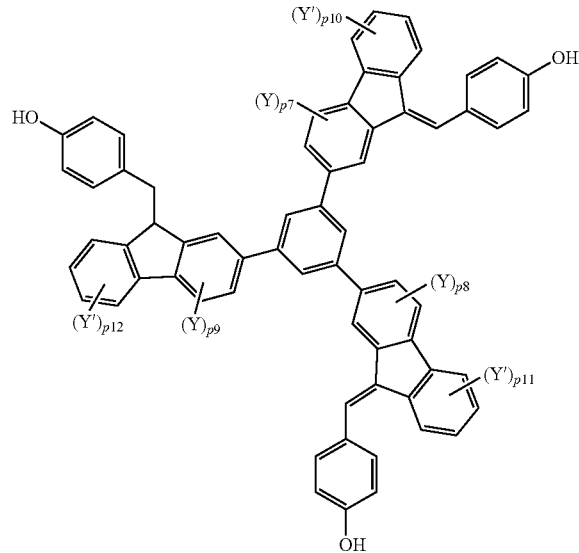

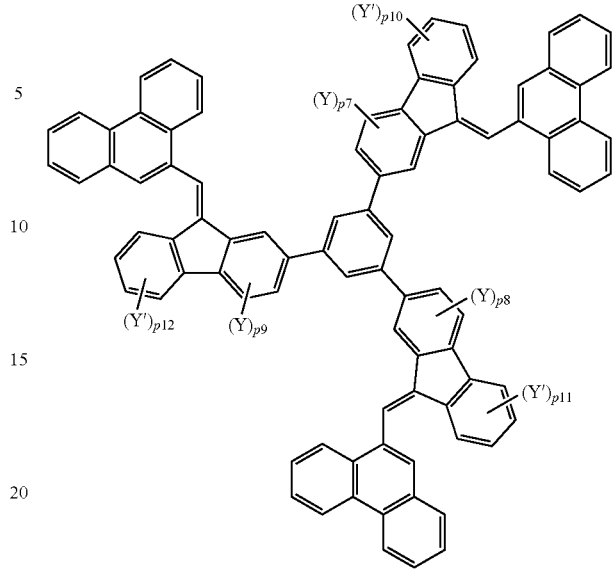

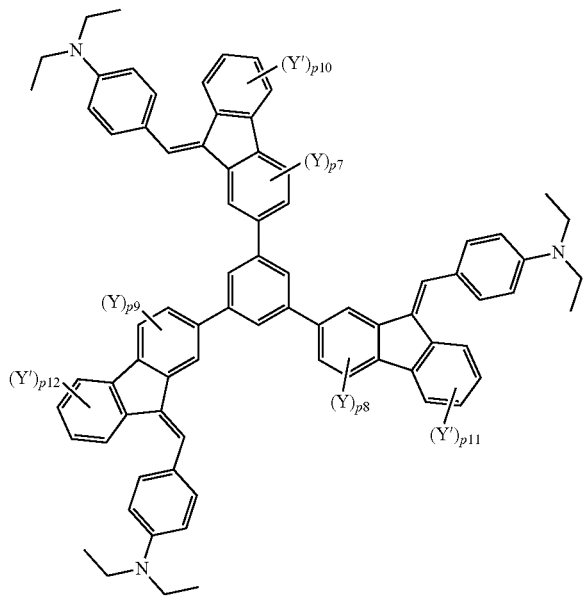

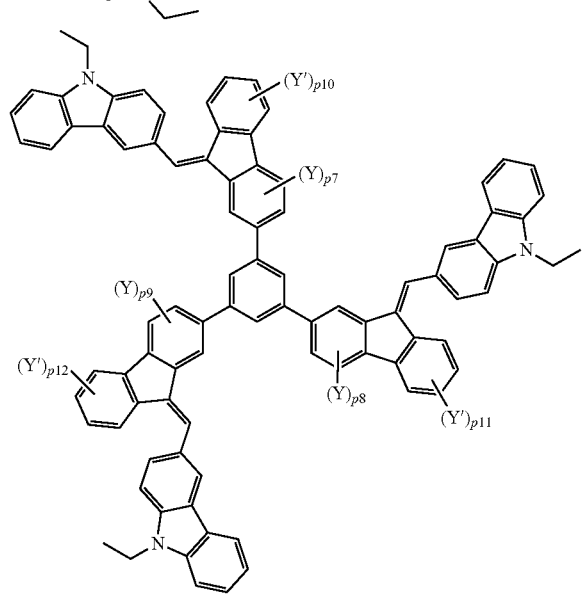

In the above formulae, Y and Y' are as defined in the above formula (1). p7, p8 and p9 are each independently an integer of 0 to 3. p10, p11 and p12 are each independently an integer of 0 to 4. In a case in which p7 is no less than 2, a plurality of Ys are identical or different. In a case in which p8 is no less than 2, a plurality of Ys are identical or different. In a case in which p9 is no less than 2, a plurality of Ys are identical or different. In a case in which p10 is no less than 2, a plurality of Y's are identical or different. In a case in which p11 is no less than 2, a plurality of Y's are identical or different. In a case in which p12 is no less than 2, a plurality of Y's are identical or different.

The lower limit of the molecular weight of the compound (A) is preferably 350, more preferably 400, still more preferably 500, and particularly preferably 600. The upper limit of the absolute molecular weight is preferably 3,000, more preferably 2,000, and still more preferably 1,500. When the molecular weight of the compound (A) falls within the above range, the flatness of the resist underlayer film can be more improved.

When the compound (A) is a mixture or a polymer with a molecular weight distribution, the lower limit of the weight average molecular weight (Mw) of the compound (A) is preferably 500 and more preferably 1,000. The upper limit of Mw is preferably 50,000, more preferably 10,000, and still more preferably 8,000.

The lower limit of the content of the compound (A) with respect to the total solid content in the composition for resist underlayer film formation is preferably 70% by mass, more preferably 80% by mass, and still more preferably 85% by mass. The upper limit of the content is, for example, 100% by mass. The "total solid content" as referred to means the sum of the components other than the solvent (B) in the composition for resist underlayer film formation of the present embodiment.

The lower limit of the content of the compound (A) in the composition for resist underlayer film formation is preferably 1% by mass, more preferably 3% by mass, and still more preferably 5% by mass. The upper limit of the content is preferably 50% by mass, more preferably 30% by mass, and still more preferably 15% by mass. The compound (A) may be used either alone of one type, or in combination of two or more types thereof.

(B) Solvent

The solvent (B) is not particularly limited as long as it can dissolve or disperse the compound (A), and the optional component contained as needed.

The solvent (B) is exemplified by an alcohol solvent, a ketone solvent, an ether solvent, an ester solvent, a nitrogen-containing solvent, and the like. The solvent (B) may be used either alone of one type, or in combination of two or more types thereof.

Examples of the alcohol solvent include: monohydric alcohol solvents such as methanol, ethanol and n-propanol; polyhydric alcohol solvents such as ethylene glycol and 1,2-propylene glycol; and the like.

Examples of the ketone solvent include: chain ketone solvents such as methyl ethyl ketone and methyl-iso-butyl ketone; cyclic ketone solvents such as cyclohexanone; and the like.

Examples of the ether solvent include:

polyhydric alcohol ether solvents e.g. chain ether solvents such as n-butyl ether, and cyclic ether solvents such as tetrahydrofuran;

polyhydric alcohol partially etherated solvents e.g. diethylene glycol monomethyl ether;

and the like.

Examples of the ester solvent include: carbonate solvents such as diethyl carbonate; acetic acid monoester solvents such as methyl acetate and ethyl acetate; lactone solvents such as γ-butyrolactone; polyhydric alcohol partially etherated carboxylate solvents such as diethylene glycol monomethyl ether acetate and propylene glycol monomethyl ether acetate; lactic acid ester solvents such as methyl lactate and ethyl lactate; and the like.

Examples of the nitrogen-containing solvent include: chain nitrogen-containing solvents such as N,N-dimethylacetamide; cyclic nitrogen-containing solvents such as N-methylpyrrolidone; and the like.

Of these, the ether solvent and the ester solvent are preferred, and the ether solvent and the ester solvent each having a glycol structure are more preferred in light of superior film formability.

Examples of the ether solvent and the ester solvent each having a glycol structure include propylene glycol monomethyl ether, propylene glycol monoethyl ether, propylene glycol monopropyl ether, propylene glycol monomethyl ether acetate, propylene glycol monoethyl ether acetate, propylene glycol monopropyl ether acetate, and the like. Of these, propylene glycol monomethyl ether acetate is particularly preferred.

The lower limit of the percentage content of the ether solvent and the ester solvent each having a glycol structure in the solvent (B) is preferably 20% by mass, more preferably 60% by mass, still more preferably 90% by mass, and particularly preferably 100% by mass.

(C) Acid Generating Agent

The acid generating agent (C) is a component that generates an acid by an action of heat and/or light and facilitates the crosslinking of molecules of the compound (A). When the composition for resist underlayer film formation contains the acid generating agent (C), the crosslinking reaction of molecules of the compound (A) is facilitated and the hardness of the formed film may be further increased. The acid generating agent (C) may be used either alone of one type, or in combination of two or more types thereof.

The acid generating agent (C) is exemplified by an onium salt compound, an N-sulfonyloxyimide compound, and the like.

The onium salt compound is exemplified by a sulfonium salt, a tetrahydrothiophenium salt, an iodonium salt, an ammonium salt, and the like.

Examples of the sulfonium salt include triphenylsulfonium trifluoromethanesulfonate, triphenylsulfonium nonafluoro-n-butanesulfonate, triphenylsulfonium 2-bicyclo[2.2.1]hept-2-yl-1,1,2,2,-tetrafluoroethanesulfonate, 4-cyclohexylphenyldiphenylsulfonium trifluoromethanesulfonate, and the like.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, and the like.

Examples of the iodonium salt include diphenyliodonium trifluoromethanesulfonate, diphenyliodonium nonafluoro-n-butanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, and the like.

Examples of the ammonium salt include triethylammonium trifluoromethane sulfonate, triethylammonium nonafluoro-n-butanesulfonate and the like.

Examples of the N-sulfonyloxyimide compound include N-(trifluoromethanesulfonyloxy)bicyclo[2.2.1]hept-5-ene-2,3-dicarboxyimide, N-(nonafluoro-n-butane sulfonyloxy)bicyclo[2.2.1]hept-5-ene-2,3-dicarboxyimide, and the like.

The acid generating agent (C) is preferably the onium salt compound, more preferably the iodonium salt and the ammonium salt, still more preferably the iodonium salt, and particularly preferably bis(4-t-butylphenyl)iodonium nonafluoro-n-butanesulfonate.

When the composition for resist underlayer film formation contains the acid generating agent (C), the lower limit of the content of the acid generating agent (C) with respect to 100 parts by mass of the compound (A) is preferably 0.1 parts by mass, more preferably 1 part by mass, and still more preferably 3 parts by mass. The upper limit of the content of the acid generating agent (C) with respect to 100 parts by mass of the compound (A) is preferably 20 parts by mass, more preferably 15 parts by mass, and still more preferably 10 parts by mass. When the content of the acid generating agent (C) falls within the above range, the crosslinking reaction of molecules of the compound (A) may be facilitated more effectively.

(D) Crosslinkable Compound

The crosslinkable compound (D) is a component that forms a crosslinking bond between components, such as the compound (A) in the composition for resist underlayer film formation by an action of heat and/or an acid, or a component that itself constitutes a cross-linked structure by an action of heat and/or an acid (except for those corresponding to the compound (A)). When the composition for resist underlayer film formation contains the crosslinkable compound (D), the hardness of the resist underlayer film to be formed can be increased. The crosslinkable compound (D) may be used either alone of one type, or in combination of two or more types thereof.

The crosslinkable compound (D) is exemplified by a polyfunctional (meth)acrylate compound, an epoxy compound, a hydroxymethyl group-substituted phenol compound, an alkoxyalkyl group-containing phenol compound, a compound having an alkoxyalkylated amino group, a random copolymer of an acenaphthylene with hydroxymethylacenaphthylene which is represented by the following formula (11-P), compounds represented by the following formulae (11-1) to (11-12), and the like.

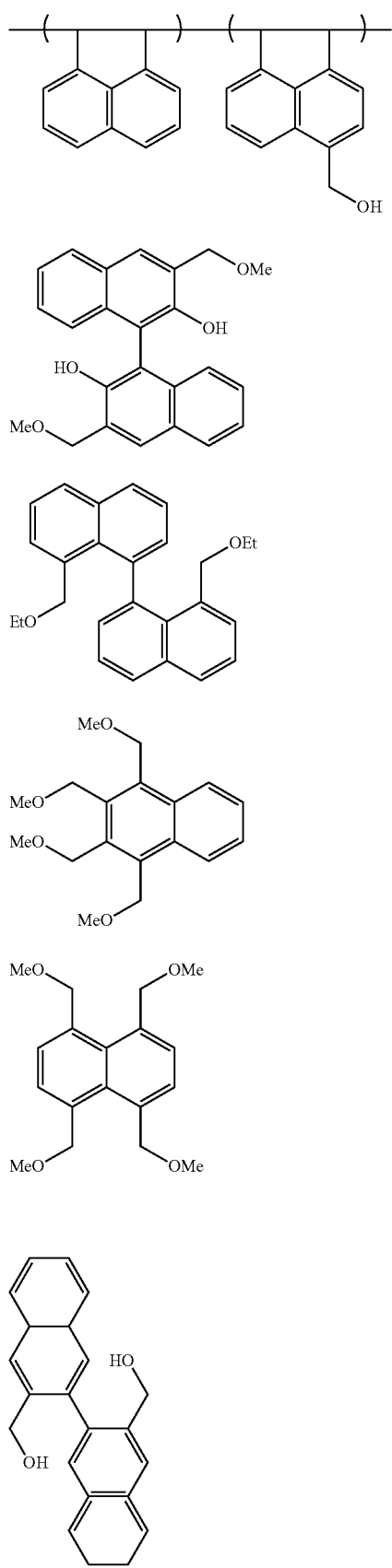
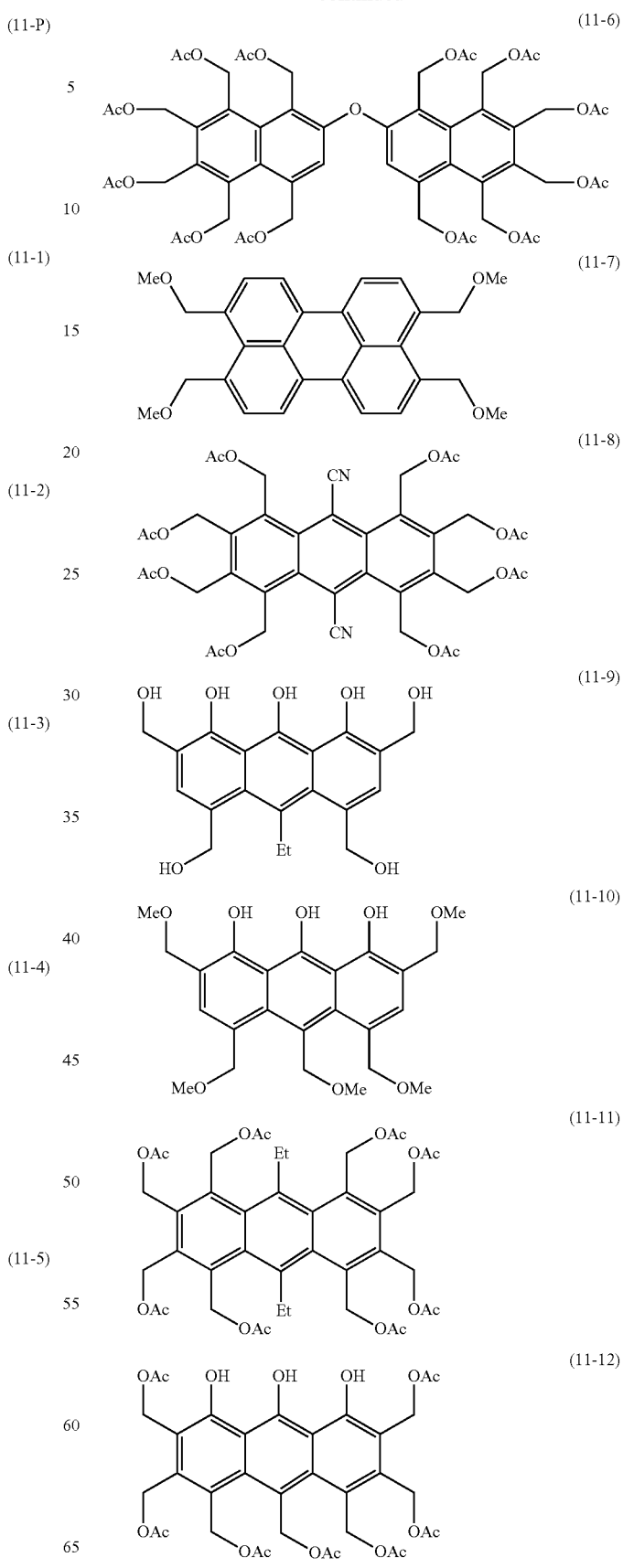

In the above formula, Me represents a methyl group, Et represents an ethyl group, and Ac represents an acetyl group.

It is to be noted that the compounds represented by the above formulae (11-1) to (11-12) each may be synthesized with reference to the following documents.

The compound represented by the formula (11-1):

Guo, Qun-Sheng; Lu, Yong-Na; Liu, Bing; Xiao, Jian; and Li, Jin-Shan, Journal of Organometallic Chemistry, 2006, vol. 691, #6, p. 1282-1287.

The compound represented by the formula (11-2):

Badar, Y. et al., Journal of the Chemical Society, 1965, p. 1412-1418.

The compound represented by the formula (11-3):

Hsieh, Jen-Chieh; Cheng, Chien-Hong, Chemical Communications (Cambridge, United Kingdom), 2008, #26, p. 2992-2994.

The compound represented by the formula (11-4):

Japanese Unexamined Patent Application, Publication No. H5-238990.

The compound represented by the formula (11-5):

Bacon, R. G. R.; Bankhead, R., Journal of the Chemical Society, 1963, p. 839-845.

The compounds represented by the formulae (11-6), (11-8), (11-11) and (11-12):

Macromolecules, 2010, vol. 43, p. 2832-2839.

The compounds represented by the formulae (11-7), (11-9) and (11-10):

Polymer Journal, 2008, vol. 40, No. 7, p. 645-650; and Journal of Polymer Science: Part A, Polymer Chemistry, vol. 46, p. 4949-4958.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

Examples of the epoxy compound include novolak epoxy resins, bisphenol epoxy resins, alicyclic epoxy resins, aliphatic epoxy resins, and the like.

Examples of the hydroxymethyl group-substituted phenol compound include 2-hydroxymethyl-4,6-dimethylphenol, 1,3,5-trihydroxymethylbenzene, 3,5-dihydroxymethyl-4-methoxytoluene (i.e., 2,6-bis(hydroxymethyl)-p-cresol), and the like.

Examples of the alkoxyalkyl group-containing phenol compound include a methoxymethyl group-containing phenol compound, an ethoxymethyl group-containing phenol compounds, and the like. The methoxymethyl group-containing phenol compound is exemplified by compounds represented by the following formula (11-Q).

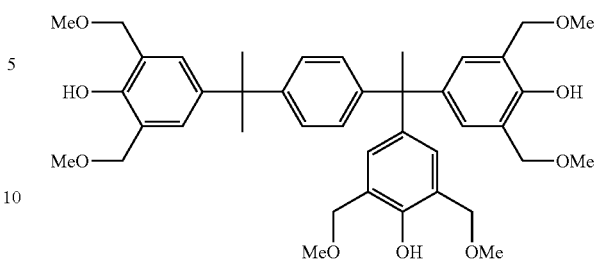

(11-Q)

Examples of the compound having an alkoxyalkylated amino group include nitrogen-containing compounds having a plurality of active methylol groups in a molecule thereof, wherein the hydrogen atom of the hydroxyl group of at least one of the methylol groups is substituted with an alkyl group such as a methyl group or a butyl group, and the like; examples thereof include (poly)methylolated melamines, (poly)methylolated glycolurils, (poly)methylolated benzoguanamines, (poly)methylolated ureas, and the like. It is to be noted that a mixture constituted with a plurality of substituted compounds described above may be used as the compounds having an alkoxyalkylated amino group, and the compound having an alkoxyalkylated amino group may contain an oligomer component formed through partial self-condensation thereof. The exemplary compound having an alkoxyalkylated amino group is 1,3,4,6-tetrakis (methoxymethyl)glycoluril.

Among these crosslinkable compounds, the methoxymethyl group-containing phenol compound, the compound having an alkoxyalkylated amino group and the random copolymer of acenaphthylene with hydroxymethylacenaphthylene are preferred, the methoxymethyl group-containing phenol compound and the compound having an alkoxyalkylated amino group are more preferred, and 4,4'-(1-(4-(1-(4-hydroxy-3,5-bis(methoxymethyl)phenyl)-1-methylethyl) phenyl)ethylidene)bis(2,6-bis(methoxymethyl)phenol (compound represented by the above formula (1 1-Q)) and 1,3,4,6-tetrakis(methoxymethyl)glycoluril are still more preferred.

When the composition for resist underlayer film formation contains the crosslinkable compound (D), the lower limit of the content of the crosslinkable compound (D) with respect to 100 parts by mass of the compound (A) is preferably 0.1 parts by mass, more preferably 1 part by mass, still more preferably 3 parts by mass, and particularly preferably 5 parts by mass. The upper limit of the content of the crosslinking agent with respect to 100 parts by mass of the compound (A) is preferably 100 parts by mass, more preferably 50 parts by mass, still more preferably 30 parts by mass, and particularly preferably 20 parts by mass. When the content of the crosslinkable compound (D) falls within the above range, the crosslinking reaction of molecules of the compound (A) may be allowed to occur more effectively.

Other Optional Component

The other optional component is exemplified by a surfactant, an adhesion aid, and the like.

Surfactant

When the composition for resist underlayer film formation contains the surfactant, application properties thereof can be improved, and consequently uniformity of the surface of the formed film may be improved and occurrence of the unevenness of coating can be inhibited. The surfactant may be used either alone of one type, or in combination of two or more types thereof.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate, and the like. KP341 (available from Shin-Etsu Chemical Co., Ltd.); Polyflow No. 75 and Polyflow No. 95 (each available from Kyocisha Chemical Co., Ltd.); EFTOP EF101, EFTOP EF204, EFTOP EF303 and EFTOP EF352 (each available from Tochem Products Co. Ltd.); Megaface F171, Megaface F172 and Megaface F173 (each available from DIC Corporation); Fluorad FC430, Fluorad FC431, Fluorad FC135 and Fluorad FC93 (each available from Sumitomo 3M Limited); ASAHI GUARD AG710, Surflon S382, Surflon SC101, Surflon SC102, Surflon SC103, Surflon SC104, Surflon SC105 and Surflon SC106 (each available from Asahi Glass Co., Ltd.); and the like.

When the composition for resist underlayer film formation contains the surfactant, the lower limit of the content of the surfactant with respect to 100 parts by mass of the compound (A) is preferably 0.01 parts by mass, more preferably 0.05 parts by mass, and still more preferably 0.1 parts by mass. The upper limit of the content the surfactant with respect to 100 parts by mass of the compound (A) is preferably 10 parts by mass, more preferably 5 parts by mass, and still more preferably 1 part by mass. When the content of the surfactant falls within the above range, the application properties of the composition for resist underlayer film formation may be more improved.

Preparation Process of Composition for Resist Underlayer Film Formation

The composition for resist underlayer film formation may be prepared, for example, by mixing the compound (A) and the solvent (B), as well as, as needed, the acid generating agent (C), the crosslinkable compound (D) and the other optional component at a certain ratio, preferably followed by filtering a mixture thus obtained through a membrane filter having a pore size of about 0.1 m. The lower limit of the solid content concentration of the composition for resist underlayer film formation is preferably 0.1% by mass, more preferably 1% by mass, still more preferably 3% by mass, and particularly preferably 5% by mass. The upper limit of the solid content concentration of the composition for resist underlayer film formation is preferably 50% by mass, more preferably 30% by mass, still more preferably 20% by mass, and particularly preferably 15% by mass.

The composition for resist underlayer film formation according to the present embodiment is capable of forming a film that is superior in flatness, solvent resistance, heat resistance and etching resistance, and may therefore be suitably used for formation of a resist underlayer film in the production of semiconductor devices and the like. The composition for resist underlayer film formation may also be used for formation of a protective film, an insulating film and a colored cured film in a display device and the like.

Resist Underlayer Film

The resist underlayer film according to still another embodiment of the present invention is formed from the composition for resist underlayer film formation according to the embodiment of the present invention. Since the resist underlayer film is formed from the composition for resist underlayer film formation described above, the resist underlayer film is superior in flatness, solvent resistance, heat resistance and etching resistance.

Resist Underlayer Film Forming Method

The resist underlayer film forming method comprises: applying the composition for resist underlayer film formation according to the embodiment directly or indirectly on an upper face side of a substrate (hereinafter, may be also referred to as "applying step"); and heating a coating film obtained after the applying step (hereinafter, may be also referred to as "heating step"). The resist underlayer film forming method according to the embodiment allows formation of a resist underlayer film that is superior in flatness, solvent resistance, heat resistance and etching resistance.

Applying Step

In this step, the composition for resist underlayer film formation according to the embodiment is applied directly or indirectly on an upper face side of a substrate.

Examples of the substrate include a silicon wafer, a wafer coated with aluminum, and the like. The method for applying the composition for resist underlayer film formation is not particularly limited, and for example, an appropriate process such as a spin-coating process, a cast-coating process and a roll-coating process may be employed to form a coating film.

Heating Step

In this step, the coating film obtained after the applying step is heated. The resist underlayer film is thus formed.

Heating of the coating film is typically carried out in an ambient air. The lower limit of the temperature for the heating is preferably 120° C., more preferably 150° C., and still more preferably 200° C. The upper limit of the temperature for the heating is preferably 500° C., more preferably 400° C., and still more preferably 300° C. When the temperature for the heating is less than 120° C., the oxidative crosslinking may not sufficiently proceed, and characteristics necessary for use in the resist underlayer film may not be exhibited. The lower limit of the time period of the heating is preferably 15 sec, more preferably 30 sec, and still more preferably 45 sec. The upper limit of the time period of the heating is preferably 1,200 sec, more preferably 600 sec, and still more preferably 300 sec.

The coating film may be preheated at a temperature of no less than 60° C. and no greater than 100° C. before being heated at a temperature of no less than 120° C. and no greater than 500° C. The lower limit of the heating time period in the preheating is preferably 10 sec, and more preferably 30 sec. The upper limit of the heating time period is preferably 300 sec, and more preferably 180 sec.

It is to be noted that in the resist underlayer film formation method, the resist underlayer film is typically formed through the heating of the coating film; however, in a case in which the composition for resist underlayer film formation contains the acid generating agent (C) which is a radiation-sensitive acid generating agent, the resist underlayer film may also be formed by hardening the film through a combination of an exposure and heating. The radioactive ray used for the exposure may be appropriately selected from: electromagnetic waves such as visible rays, ultraviolet rays, far ultraviolet rays, X-rays and γ radiations; particle rays such as electron beams, molecular beams and ion beams, and the like in accordance with the type of the acid generating agent (C).

The lower limit of the average thickness of the resist underlayer film formed is preferably 30 nm, more preferably 50 nm, and still more preferably 100 nm. The upper limit of the average thickness is preferably 3,000 nm, more preferably 2,000 nm, and still more preferably 500 nm.

Patterned Substrate Production Method

The patterned substrate production method according to the present embodiment comprises: forming a resist pattern on an upper face side of the resist underlayer film obtained by the resist underlayer film formation method according to the embodiment (hereinafter, may be also referred to as "resist pattern forming step"); and carrying out etching using the resist pattern as a mask (hereinafter, may be also referred to as "etching step").

According to the patterned substrate production method, use of the resist underlayer film that is superior in solvent resistance, heat resistance and etching resistance obtained by the resist underlayer film formation method enables a patterned substrate having a superior pattern configuration to be obtained.

The patterned substrate production method may include as needed, prior to the resist pattern forming step, a step of forming an intermediate layer (intermediate film) on the upper face side of the resist underlayer film (hereinafter, may be also referred to as "intermediate layer forming step"). Hereinafter, each step is explained.

Intermediate Layer Forming Step

In this step, an intermediate layer is formed on the upper face side of the resist underlayer film. The intermediate layer as referred to means a layer having a function that is exhibited or not exhibited by the resist underlayer film and/or the resist film in resist pattern formation in order to further enhance the function exhibited by the resist underlayer film and/or the resist film, or to impart to the resist underlayer film and/or the resist film a function not exhibited thereby. For example, when an antireflective film is provided as the intermediate layer, an antireflecting function of the resist underlayer film may be further enhanced.

The intermediate layer may be formed from an organic compound and/or an inorganic oxide. Examples of the organic compound include commercially available products such as: "DUV-42", "DUV-44", "ARC-28" and "ARC-29" (each available from Brewer Science); "AR-3" and "AR-19" (each available from Lohm and Haas Company); and the like. Examples of the inorganic oxide include commercially available products such as "NFC SOG01", "NFC SOG04" and "NFC SOG080" (each JSR Corporation), and the like. Also, as the inorganic oxide, polysiloxane, titanium oxide, aluminum oxide, tungsten oxide, and the like that are provided through a CVD process may be used.

The method for providing the intermediate layer is not particularly limited, and for example, a coating method, a CVD technique, or the like may be employed. Of these, the coating method is preferred. In a case where the coating method is employed, the intermediate layer may be successively provided after the resist underlayer film is formed. Moreover, the average thickness of the intermediate layer is appropriately selected in accordance with the function required for the intermediate layer, and the lower limit of the average thickness of the intermediate layer is preferably 10 nm, and more preferably 20 nm. The upper limit of the average thickness of the intermediate layer is preferably 3,000 nm, and more preferably 300 nm.

Resist Pattern-Forming Step

In this step, a resist pattern is formed on the upper face side of the resist underlayer film. In the case in which the intermediate layer forming step is involved, the resist pattern is formed on the upper face side of the intermediate layer. This step may be carried out by, for example, using a resist composition.

When the resist composition is used, specifically, the resist film is formed by applying the resist composition such that a resultant resist film has a predetermined thickness and thereafter subjecting the resist composition to prebaking to evaporate the solvent in the coating film.

Examples of the resist composition include a chemically amplified positive or negative resist composition that contains a radiation-sensitive acid generating agent; a positive resist composition containing an alkali-soluble resin and a quinone diazide-based photosensitizing agent; a negative resist composition containing an alkali-soluble resin and a crosslinkable compound; and the like.

The lower limit of the solid content concentration of the resist composition is preferably 0.3% by mass, and more preferably 1% by mass. The upper limit of the solid content concentration of the resist composition is preferably 50% by mass, and more preferably 30% by mass. Moreover, the resist composition is generally used for providing a resist film, for example, after being filtered through a filter with a pore size of 0.2 m. It is to be noted that a commercially available resist composition may be used as is in this step.

The method for applying the resist composition is not particularly limited, and examples thereof include a spin-coating method, and the like. The temperature of the prebaking may be appropriately adjusted in accordance with the type of the resist composition employed and the like; however, the lower limit of the temperature is preferably 30° C., and more preferably 50° C. On the other hand, the upper limit of the aforementioned temperature is preferably 200° C., and more preferably 150° C. The lower limit of a time period for the prebaking is preferably 10 sec, and more preferably 30 sec. The upper limit of the time period is preferably 600 sec, and more preferably 300 sec.

Next, the resist film formed is exposed by selective irradiation with a radioactive ray. The radioactive ray used in the exposure may be appropriately selected from: electromagnetic waves such as visible rays, ultraviolet rays, far ultraviolet rays, X-rays and γ radiations; particle rays such as electron beams, molecular beams and ion beams in accordance with the type of the radiation-sensitive acid generating agent used in the resist composition. Among these, far ultraviolet rays are preferred, and a KrF excimer laser beam (248 nm), and an ArF excimer laser beam (193 nm), an $F_2$ excimer laser beam (wavelength; 157 nm), a $Kr_2$ excimer laser beam (wavelength: 147 nm), an ArKr excimer laser beam (wavelength: 134 nm) and extreme ultraviolet rays (EUV; wavelength:13.5 nm, etc.) are more preferred, and a KrF excimer laser beam, an ArF excimer laser beam and EUV are still more preferred.

Post-baking may be carried out after the exposure for the purpose of improving a resolution, a pattern profile, developability, and the like. The temperature of the post-baking may be appropriately adjusted in accordance with the type of the resist composition employed and the like; however, the lower limit of the temperature is preferably 50° C., and more preferably 70° C. On the other hand, the upper limit of the aforementioned temperature is preferably 200° C., and more preferably 150° C. The lower limit of a time period for the post-baking is preferably 10 sec, and more preferably 30 sec. The upper limit of the time period is preferably 600 sec, and more preferably 300 sec.

Next, the exposed resist film is developed with a developer solution to form a resist pattern. The development may be either a development with an alkali or a development with an organic solvent. In the case of the development with an alkali, examples of the developer solution include an alkaline aqueous solution that contains sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like. An appropriate amount of a water soluble organic solvent, e.g., an alcohol such as methanol and ethanol, a surfactant, and the like may be added to the alkaline aqueous solution. Alternatively, in the case of the development with an organic solvent, examples of the developer solution include a variety of organic solvents exemplified as the solvent (B) described above in connection with the composition for resist underlayer film formation, and the like.

A predetermined resist pattern is formed by the development with the developer solution, followed by washing and drying.

In carrying out the resist pattern-forming step, in addition to the process using the resist composition as described above, other processes such as a nanoimprint method and a process using a directed self-assembling composition may be employed.

Etching Step

In this step, etching is carried out using the resist pattern as a mask. A pattern is thus formed on the substrate. The etching may be carried out either once or for multiple times, i.e., the etching may be carried out successively by using a pattern obtained by the etching as a mask. In light of obtaining a pattern having a more favorable configuration, the etching is preferably carried out for multiple times. When the etching is carried out for multiple times, in a case where the intermediate layer is not provided, the resist underlayer film and the substrate are subjected to etching sequentially in this order, whereas in a case where the intermediate layer is provided, the intermediate layer, the resist underlayer film and the substrate are subjected to etching sequentially in this order. The etching procedure may be exemplified by dry-etching, wet-etching, and the like. Of these, the dry-etching is preferred in light of achieving a more superior shape of the substrate pattern. For example, gas plasma such as oxygen plasma and the like may be used in the dry-etching. After the etching, the patterned substrate having a predetermined pattern can be obtained.

EXAMPLES

Hereinafter, the embodiment of the present invention will be explained in more detail by way of Examples, but the present invention is not in any way limited to these Examples. Measuring methods for various types of physical properties are shown below.

Average Thickness of Film

The average thickness of the film was determined using a spectroscopic ellipsometer ("M2000D" available from J. A. WOOLLAM).

Synthesis of Compound (A)

Compounds represented by the following formulae (A-1) to (A-8) were synthesized by the procedure described below.

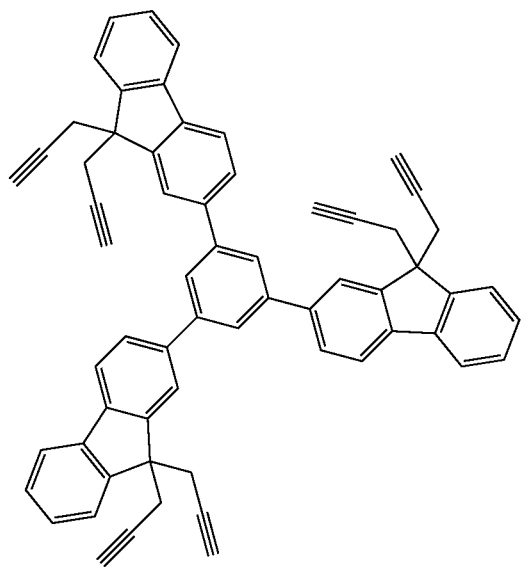

(A-1)

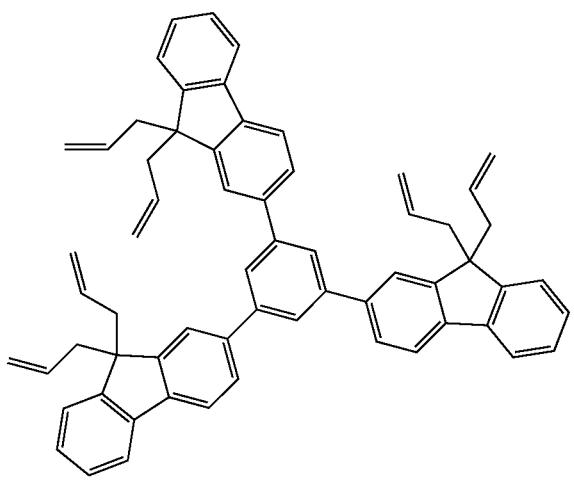

(A-2)

(A-3)
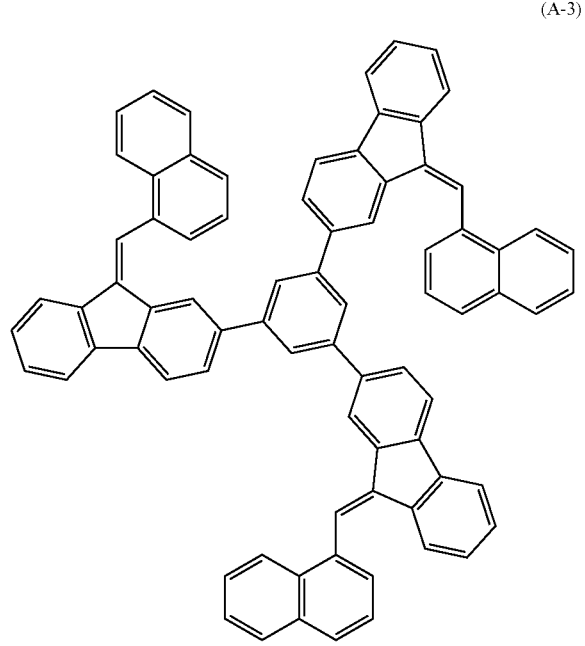
(A-4)
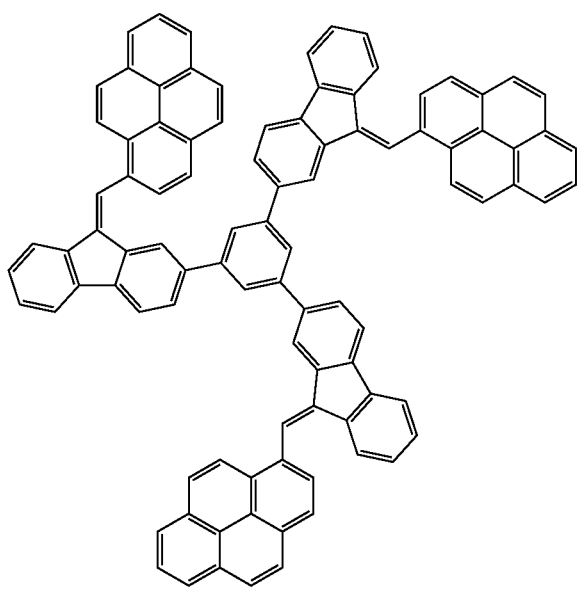
(A-5)
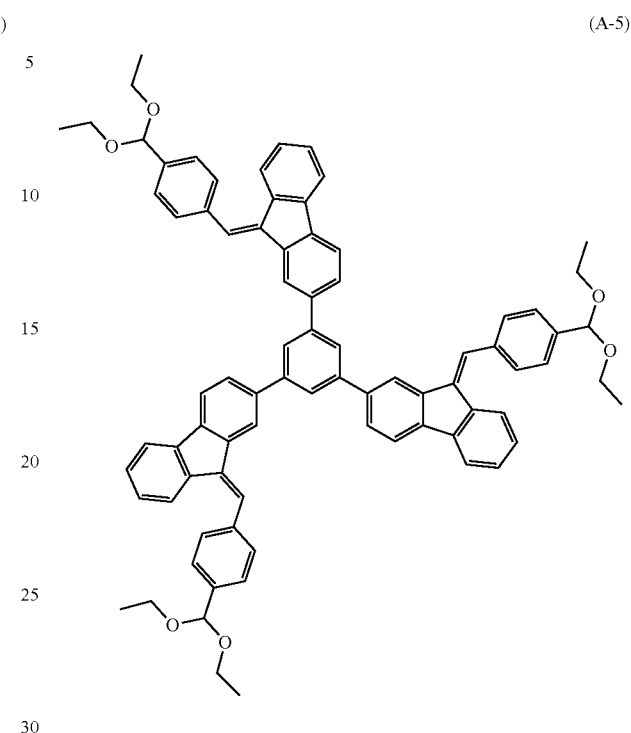
(A-6)
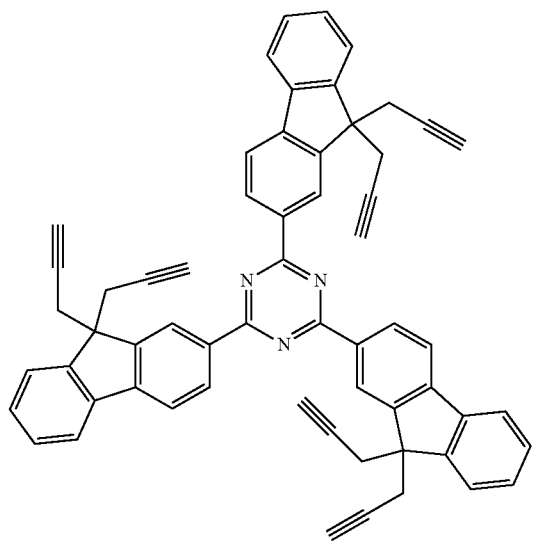

(A-7)
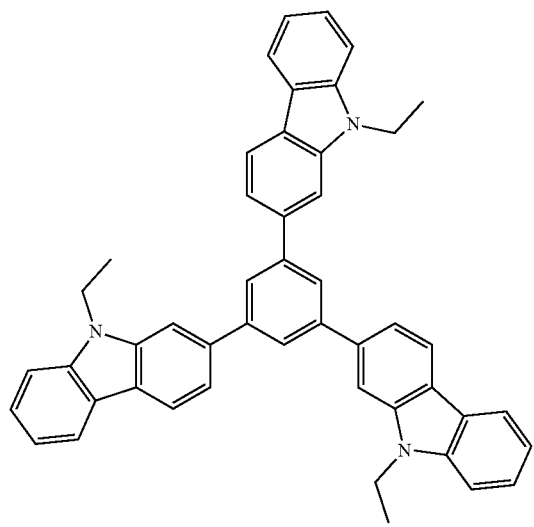
(A-8)
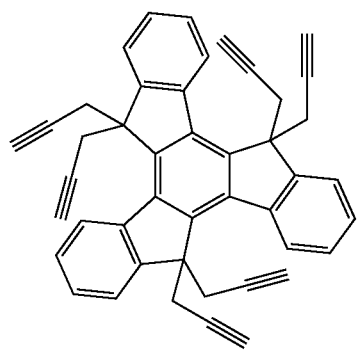
(A-9)
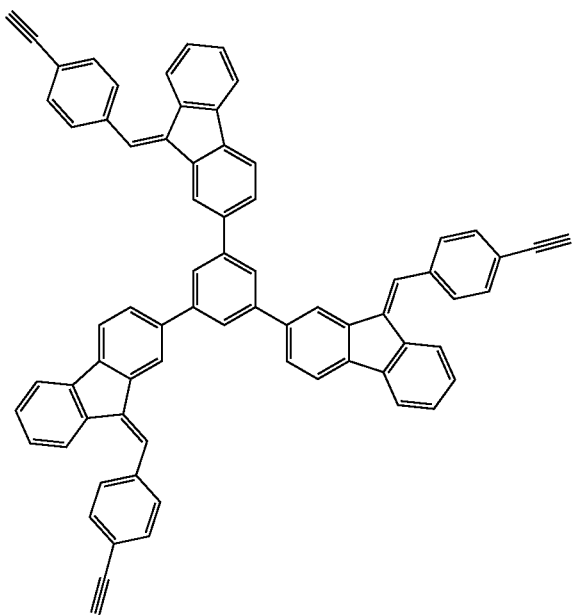
(A-10)
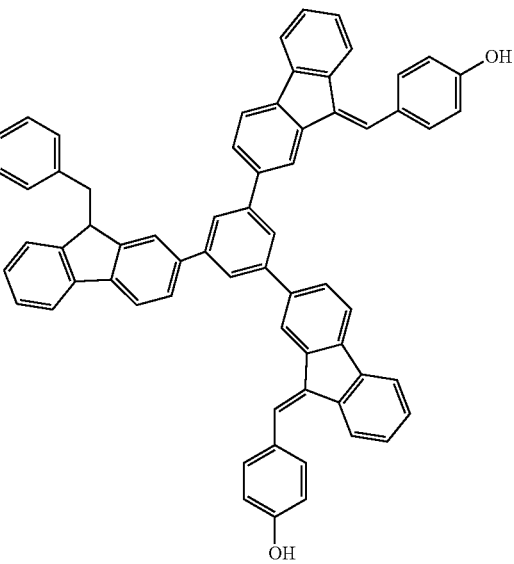
(A-11)
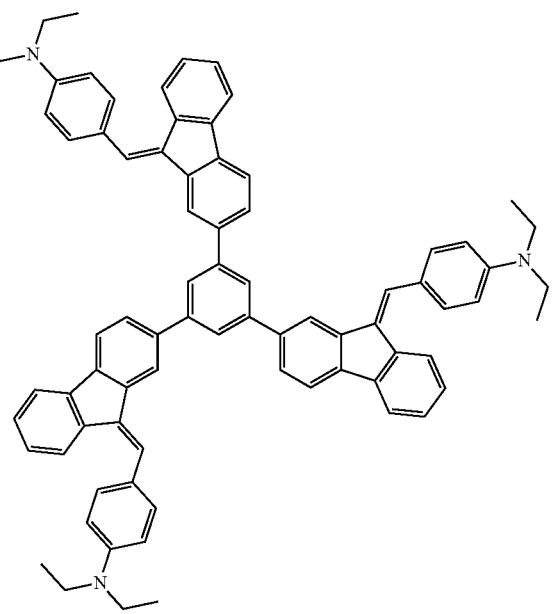

-continued (A-12)

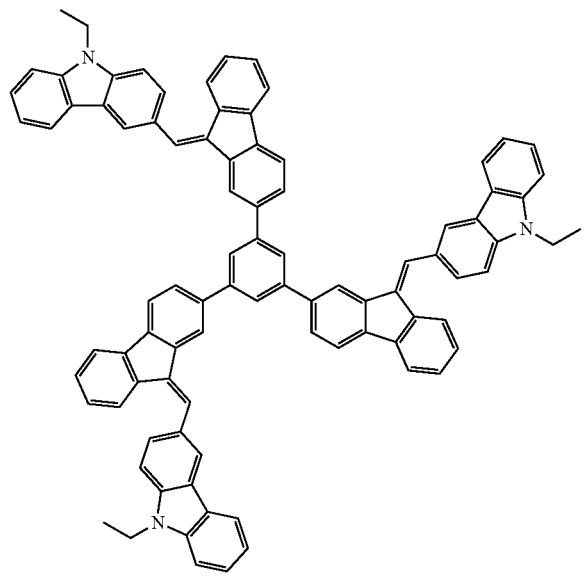

(a-1)

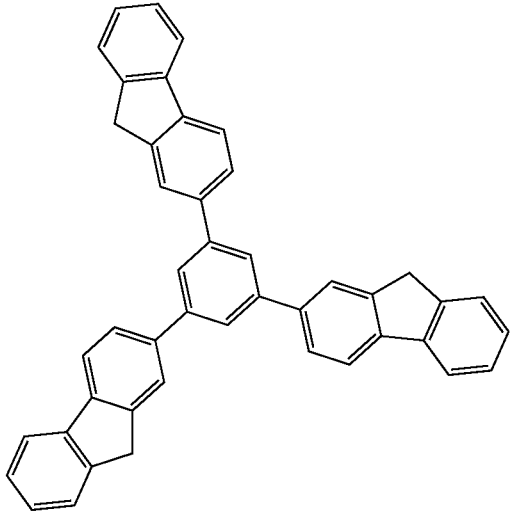

Synthesis Example 2: Synthesis of Compound (A-1)

In a nitrogen atmosphere, into a reaction vessel, 10.0 g of the compound (a-1), 18.8 g of propargyl bromide and 50 g of toluene were charged and then stirred. Subsequently, 25.2 g of 50 mass % aqueous sodium hydroxide solution and 1.7 g of tetrabutylammonium bromide were added thereto, and a reaction was allowed at 92° C. for 12 hrs. The reaction solution was cooled to 50° C. and then 25 g of tetrahydrofuran was added thereto. After removing an aqueous phase from the reaction solution, 50 g of 1 mass % aqueous oxalic acid solution was added thereto. Then extraction by liquid separation was conducted, followed by charging into hexane for precipitation. The precipitate was collected by a filter paper and dried to obtain the compound (A-1).

Synthesis Example 3: Synthesis of Compound (A-2)

The compound (A-2) was obtained in a similar manner to Synthesis Example 2, except that 19.1 g of allyl bromide was used instead of 18.8 g of propargyl bromide.

Synthesis Example 4: Synthesis of Compound (A-3)

The compound (A-3) was obtained in a similar manner to Synthesis Example 2, except that 9.9 g of 1-naphthaldehyde was used instead of 18.8 g of propargyl bromide.

Synthesis Example 5: Synthesis of Compound (A-4)

The compound (A-4) was obtained in a similar manner to Synthesis Example 2, except that 14.6 g of 1-formylpyrene was used instead of 18.8 g of propargyl bromide.

Synthesis Example 6: Synthesis of Compound (A-5)

The compound (A-4) was obtained in a similar manner to Synthesis Example 2, except that 13.2 g of terephthalaldehyde mono(diethyl acetal) was used instead of 18.8 g of propargyl bromide.

(A-13)

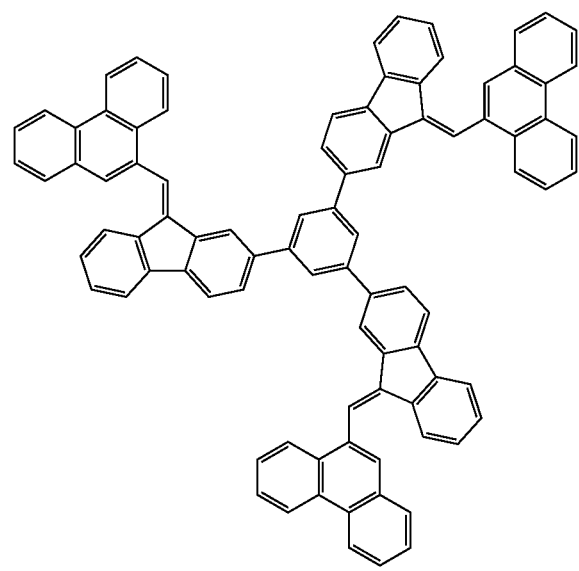

Synthesis Example 1: Synthesis of Compound (a-1)

In a nitrogen atmosphere, into a reaction vessel, 20.0 g of 2-acetylfluorene and 20.0 g of m-xylene were charged and dissolved at 110° C. Subsequently, 3.14 g of dodecylbenzene sulfonic acid was added thereto and heated to 140° C., and a reaction was allowed for 16 hrs. After completion of the reaction, the reaction solution was diluted with 80 g of xylene, cooled to 50° C., and charged into 500 g of methanol to allow precipitation. After washing the precipitate thus obtained with toluene, a solid was collected by a filter paper and dried to obtain the compound represented by the following formula (a-1).

Synthesis Example 7: Synthesis of Compound (a-2)

In a nitrogen atmosphere, into a reaction vessel, 10.0 g of 2-cyanofluorene and 88.8 g of dichloromethane were charged and cooled to 5° C. Then, 7.9 g of trifluoromethanesulfonic acid was added dropwise thereto and a reaction was allowed at a temperature from 20° C. to 25° C. for 24 hrs. A large amount of an aqueous sodium hydrogencarbonate solution was added to the reaction solution for neutralization. A deposited solid was collected by a filter paper, washed with dichloromethane, and dried to obtain the compound represented by the following formula (a-2).

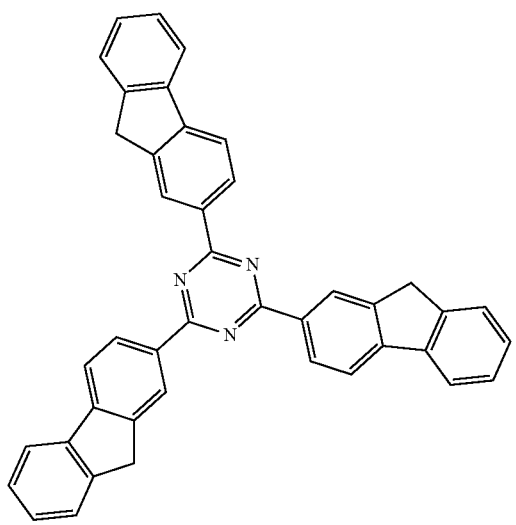

(a-2)

Synthesis Example 8

In a nitrogen atmosphere, into a reaction vessel, 5.0 g of the compound (a-2), 7.5 g of propargyl bromide, 12.6 g of 50 mass % aqueous sodium hydroxide solution, 0.8 g of tetrabutylammonium bromide and 25.7 g of toluene were charged, and a reaction was allowed at 92° C. for 12 hrs. The reaction solution was cooled to 50° C. and then 25 g of tetrahydrofuran was added thereto for dilution. After removing an aqueous phase from the reaction solution, 50 g of 1 mass % aqueous oxalic acid solution was added thereto. Then extraction by liquid separation was conducted, followed by charging into hexane for precipitation. The precipitate was collected by a filter paper and dried to obtain the compound (A-6).

Synthesis Example 9

In a nitrogen atmosphere, into a reaction vessel, 15.0 g of 2-acetyl-9-ethylcarbazole, 14.9 g of thionyl chloride and 2.8 g of ethanol were charged and a reaction was allowed at 80° C. for 8 hrs. To the reaction solution thus obtained, 50 g of water and 50 g of dichloromethane were added. Then extraction by liquid separation was conducted, followed by concentration of an organic layer thus obtained by using an evaporator, and drying, whereby the compound (A-7) was obtained.

Synthesis Example 10

In a nitrogen atmosphere, into a reaction vessel, 10.0 g of truxene, 31.3 g of propargyl bromide and 50 g of toluene were charged and then stirred. Subsequently, 42.0 g of 50 mass % aqueous sodium hydroxide solution and 2.8 g of tetrabutylammonium bromide were added thereto, and a reaction was allowed at 92° C. for 12 hrs. After cooling the reaction solution to 50° C., an aqueous phase was removed and 50 g of 1 mass % aqueous oxalic acid solution was added thereto. Then extraction by liquid separation was conducted, followed by charging into a mixed solvent of methanol and water (mass ratio: methanol/water=70/30) for precipitation. The precipitate was collected by a filter paper and dried to obtain the compound (A-8).

Synthesis Example 12: Synthesis of Compound (A-9)

In a nitrogen atmosphere, into a reaction vessel, 10.0 g of the compound (a-1), 12.76 g of 4-(trimethylsilyl ethynyl) benzaldehyde and 50 g of tetrahydrofuran were charged and then stirred. Subsequently, 37.9 g of 20 mass % aqueous sodium hydroxide solution and 1.7 g of tetrabutylammonium bromide were added thereto, and a reaction was allowed at 35° C. for 3 hrs. The reaction solution was cooled to the room temperature, and 15 g of methyl isobutyl ketone was added thereto. After removing an aqueous phase from the reaction solution, extraction by liquid separation with 50 g of 1 mass % aqueous oxalic acid solution was repeated three times, followed by charging into hexane for precipitation. The precipitate was collected by a filter paper and dried to obtain the compound (A-9).

Synthesis Example 13: Synthesis of Compound (A-10)

In a nitrogen atmosphere, into a reaction vessel, 10.0 g of the compound (a-1), 11.4 g of 4-(2-tetrahydro-2H-pyranoxy) benzaldehyde and 50 g of tetrahydrofuran were charged and then stirred. Subsequently, 25.2 g of 50 mass % aqueous sodium hydroxide solution and 1.7 g of tetrabutylammonium bromide were added thereto, and a reaction was allowed at 50° C. for 12 hrs. After removing an aqueous phase, 10 g of 35% hydrochloric acid was added to the reaction solution and stirred for 2 hrs to allow for a deprotect reaction. After completion of the reaction, 15 g of methyl isobutyl ketone was added thereto for removal of an aqueous phase. Extraction by liquid separation with 50 g of water was repeated three times, followed by charging into hexane for precipitation. The precipitate was collected by a filter paper and dried to obtain the compound (A-10).

Synthesis Example 14: Synthesis of Compound (A-11)

The compound (A-11) was obtained in a similar manner to Synthesis Example 2, except that 6.5 g of 4-diethylamino benzaldehyde was used instead of 18.8 g of propargyl bromide.

Synthesis Example 15: Synthesis of Compound (A-12)

The compound (A-12) was obtained in a similar manner to Synthesis Example 2, except that 12.3 g of N-ethylcarbazole-3-carboxyaldehyde was used instead of 18.8 g of propargyl bromide.

Synthesis Example 16: Synthesis of Compound (A-13)

The compound (A-13) was obtained in a similar manner to Synthesis Example 2, except that 11.4 g of 9-phenanthrene carbaldehyde was used instead of 18.8 g of propargyl bromide.

Synthesis Example 11: Synthesis of Polymer (b-2)

Into a reaction vessel, 100 parts by mass of 9,9-bis(4-hydroxyphenyl)fluorene, 300 parts by mass of propylene glycol monomethyl ether acetate and 10 parts by mass of paraformaldehyde were charged. To the mixture, 1 part by mass of p-toluenesulfonic acid monohydrate was added, and a reaction was allowed at 100° C. for 16 hrs. Thereafter, the polymerization reaction solution was charged into a large amount of a mixed solvent of methanol and water (mass ratio: methanol/water=70/30), followed by collecting a precipitate by a filter paper and drying, to obtain a polymer (b-2) having a structural unit represented by the following formula (b-2).

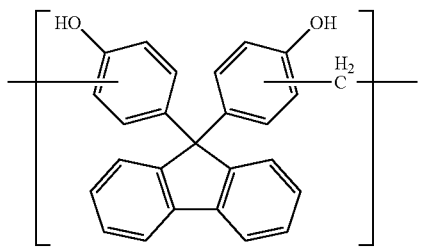

(b-2)

Preparation of Composition for Resist Underlayer Film Formation

The compound (A), the solvent (B), the acid generating agent (C) and the crosslinkable compound (D) used in the preparation of the composition for resist underlayer film formation are shown below.

(A) Compound

Examples: compounds (A-1) to (A-8) synthesized as described above

Comparative Examples: a compound represented by the following formula (b-1), the polymer (b-2) synthesized as described above, and a compound represented by the following formula (b-3)

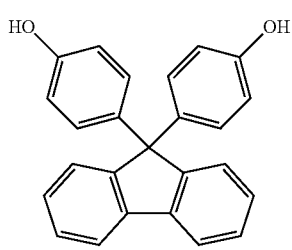

(b-1)

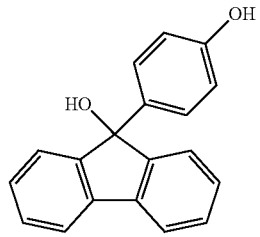

(b-3)

(B) Solvent

B-1: propylene glycol monomethyl ether acetate
B-2: cyclohexanone (C) Acid Generating Agent C-1: bis(4-t-butylphenyl)iodonium nonafluoro-n-butane-sulfonate (a compound represented by the following formula (C-1))

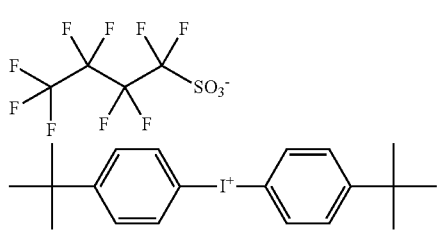

(C-1)

(D) Crosslinkable Compound

D-1: a compound represented by the following formula (D-1)

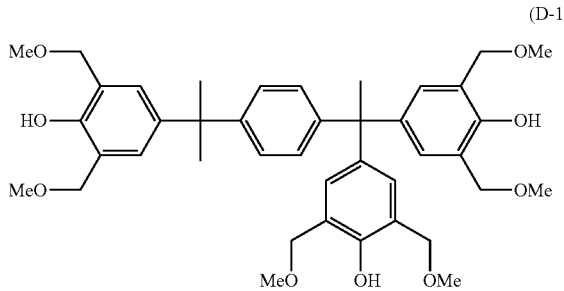

(D-1)

Example 1-1

Ten parts by mass of (A-1) as the compound (A) were dissolved in 63 parts by mass of (B-1) and 27 parts by mass of (B-2) as the solvent (B). The obtained solution was filtered through a membrane filter having a pore size of 0.1 μm to prepare a composition for resist underlayer film formation (J-1).

Examples 1-2 to 1-13 and Comparative Examples 1-1 to 1-3

Compositions for resist underlayer film formation (J-2) to (J-13) and (j-1) to (j-3) were prepared in a similar manner to Example 1-1 except that the type and the content of each component used were as specified in Table 1. In Table 1, "-" indicates that the corresponding component was not used.

TABLE 1

| Composition for resist underlayer film formation | Compound (A) Type | Content (parts by mass) | Solvent (B) Type | Content (parts by mass) | Acid generating agent (C) Type | Content (parts by mass) | Crosslinkable compound (D) Type | Content (parts by mass) |
|---|---|---|---|---|---|---|---|---|
| Example 1-1 | J-1 | A-1 | 10 | B-1/B-2 | 63/27 | — | — | — | — |
| Example 1-2 | J-2 | A-2 | 10 | B-1/B-2 | 63/27 | — | — | — | — |
| Example 1-3 | J-3 | A-3 | 10 | B-1 | 90 | C-1 | 0.5 | D-1 | 1 |
| Example 1-4 | J-4 | A-4 | 10 | B-2 | 90 | C-1 | 0.5 | D-1 | 1 |
| Example 1-5 | J-5 | A-5 | 10 | B-1 | 90 | — | — | — | — |
| Example 1-6 | J-6 | A-6 | 10 | B-1/B-2 | 63/27 | — | — | — | — |
| Example 1-7 | J-7 | A-7 | 10 | B-1/B-2 | 63/27 | C-1 | 0.5 | D-1 | 1 |
| Example 1-8 | J-8 | A-8 | 10 | B-1 | 90 | — | — | — | — |
| Example 1-9 | J-9 | A-9 | 10 | B-1 | 90 | — | — | — | — |
| Example 1-10 | J-10 | A-10 | 10 | B-1 | 90 | — | — | — | — |
| Example 1-11 | J-11 | A-11 | 10 | B-1 | 90 | — | — | — | — |
| Example 1-12 | J-12 | A-12 | 10 | B-1/B-2 | 63/27 | — | — | — | — |
| Example 1-13 | J-13 | A-13 | 10 | B-2 | 90 | C-1 | 0.5 | D-1 | — |
| Comparative Example 1-1 | j-1 | b-1 | 10 | B-1 | 90 | C-1 | 0.5 | D-1 | 1 |
| Comparative Example 1-2 | j-2 | b-2 | 10 | B-1 | 90 | C-1 | 0.5 | D-1 | 1 |
| Comparative Example 1-3 | j-3 | b-3 | 10 | B-1 | 90 | C-1 | 0.5 | D-1 | 1 |

Formation of Resist Underlayer Film

Examples 2-1 to 2-14 and Comparative Examples 2-1 to 2-3

The compositions for resist underlayer film formation prepared as described above were each applied on a silicon wafer substrate by way of a spin-coating procedure. Thereafter, baking was carried out at the temperature (° C.) for the time period (sec) shown in Table 2 under an ambient air atmosphere to form a resist underlayer film having an average thickness of 200 nm, whereby substrates having the resist underlayer film formed thereon were each obtained. In Table 2, "-" indicates that Comparative Example 2-1 served as a standard for evaluation of etching resistance.

Evaluations

For the composition for resist underlayer film formation and the substrates with a resist underlayer film obtained as described above, evaluations of the following characteristics were made according to the following procedures. The results of the evaluations are also shown in Table 2 below.

Solvent Resistance

The substrate with the resist underlayer film obtained as described above was immersed in cyclohexanone (at room temperature) for 1 min. The average film thickness was measured before and after the immersion. The average thickness of the resist underlayer film before the immersion was designated as $X_0$ and the average thickness of the resist underlayer film after the immersion was designated as X, and the absolute value of a numerical value determined according to $(X-X_0) \times 100/X_0$ was calculated and designated as the rate of change of film thickness (%). The solvent resistance was evaluated to be: "A" (favorable) in a case where the rate of change of film thickness was less than 1%; "B" (somewhat favorable) in a case where the rate of change of film thickness was no less than 1% and less than 5%; and "C" (unfavorable) in a case where the rate of change of film thickness was no less than 5%.

Etching Resistance

The resist underlayer film of the substrate provided with the resist underlayer film obtained as described above was treated in an etching apparatus ("TACTRAS" available from Tokyo Electron Limited) under conditions involving: $CF_4$/Ar=110/440 sccm, PRESS.=30 MT, HF RF=500 W, LF RF=3,000 W, DCS=−150 V, RDC=50%, and 30 sec. An etching rate (nm/min) was calculated based on the average thickness of the resist underlayer film before the treatment and the average thickness of the resist underlayer film after the treatment, and the ratio of the etching rate of the resist underlayer film of each Example to the etching rate in Comparative Example 2-1 was calculated as a standard for etching resistance evaluation. The etching resistance was evaluated to be: "A" (extremely favorable) in a case where the proportion was no less than 0.95 and less than 0.98; "B" (favorable) in a case where the proportion was no less than 0.98 and less than 1.00; and "C" (unfavorable) in a case where the proportion was no less than 1.00.

Flatness

Each of the prepared compositions for resist underlayer film formation was applied by a spin-coating procedure using a spin coater ("CLEAN TRACK ACT-12" available from Tokyo Electron Limited), on a silicon substrate 1 provided with a trench pattern having a depth of 100 nm and a groove width of 10 μm formed thereon. The rotational speed for the spin coating was the same as that in the case of forming the resist underlayer film having the average thickness of 200 nm in the "Formation of Resist Underlayer Film" described above. Subsequently, the resulting substrate was heated (baked) at 250° C. for 60 sec in an ambient air atmosphere to form a resist underlayer film covering the silicon substrate.

The cross-sectional shape of the silicon substrate covered by the resist underlayer film was observed by using a scanning electron microscope ("S-4800" available from Hitachi High-Technologies Corporation), and the difference (AFT) between the height at the center portion of the trench pattern "b" of the resist underlayer film and the height at a position 5 μm away from the edge of the trench pattern, at which no trench pattern was provided "a", was defined as a marker of the flatness. The flatness was evaluated to be "A" (extremely favorable) in the case of AFT being less than 40 nm, "B" (favorable) in the case of AFT being no less than 40 nm and less than 60 nm, and "C" (unfavorable) in the case of AFT being no less than 60 nm.

Heat Resistance

The composition for resist underlayer film formation prepared as described above was spin-coated on a silicon wafer having a diameter of 8 inches to obtain a substrate provided with a resist underlayer film. A powder was collected from the substrate provided with the resist underlayer film, and mass of the powder prior to heating was measured in a container. The powder was then heated to 400° C. in a TG-DTA apparatus ("TG-DTA2000SR" available from NETZSCH) in a nitrogen atmosphere with a rate of temperature rise of 10° C./min. The mass of the powder at 400° C. was measured. The mass loss rate (%) was obtained by the following equation and defined as a marker of heat resistance.

$$M_L = \{(m1-m2)/m1\} \times 100$$

In the above equation, $M_L$ represents the mass loss rate (%), m1 represents the mass prior to heating (mg), and m2 represents the mass at 400° C. (mg).

The smaller mass loss rate of the powder as the sample indicates that the heat resistance is more favorable as there are less sublimated matter and resist underlayer film degradation products generated during the heating of the resist underlayer film. In other words, the smaller mass loss rate indicates higher heat resistance. The heat resistance was evaluated to be: "A" (extremely favorable) in a case in which the mass loss rate was less than 5%; "B" (favorable) in a case in which the mass loss rate was no less than 5% and less than 10%; and "C" (unfavorable) in a case in which the mass loss rate was no less than 10%.

As is obvious from the results of Table 2, the composition for resist underlayer film formation of Example is capable of forming a resist underlayer film that is superior in flatness and has solvent resistance, heat resistance and etching resistance.

The composition for resist underlayer film formation according to the embodiment of the present invention is capable of forming a resist underlayer film that is superior in flatness, solvent resistance, heat resistance and etching resistance. The resist underlayer film according to the another embodiment of the present invention is superior in flatness, solvent resistance, heat resistance and etching resistance. The formation method according to the still another embodiment of the present invention enables formation of a resist underlayer film superior in flatness. The patterned substrate production method according to the yet another embodiment of the present invention enables a substrate having a superior pattern configuration to be obtained using the superior resist underlayer film formed as described above. Therefore, these can be suitably used in manufacture of semiconductor devices, and the like in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A patterned substrate production method comprising:
applying a composition for resist underlayer film formation directly or indirectly on an upper face side of a substrate to obtain a coating film;
heating the coating film to form a resist underlayer film;
forming a resist pattern on an upper face side of the resist underlayer film; and
carrying out etching using the resist pattern as a mask, wherein
the composition for resist underlayer film formation, comprising:
a compound represented by formula (2-1); and
a solvent:

(2-1)

TABLE 2

| | Composition for resist underlayer film formation | Heating temperature and time period during formation of resist underlayer film (° C./sec) | Solvent resistance | Etching resistance | Flatness | Heat resistance |
|---|---|---|---|---|---|---|
| Example 2-1 | J-1 | 400/60 | A | A | A | A |
| Example 2-2 | J-2 | 400/60 | A | A | A | A |
| Example 2-3 | J-3 | 400/60 | A | A | A | A |
| Example 2-4 | J-4 | 400/60 | A | A | A | A |
| Example 2-5 | J-5 | 400/60 | A | A | A | A |
| Example 2-6 | J-6 | 400/60 | A | A | A | A |
| Example 2-7 | J-7 | 400/60 | A | A | A | A |
| Example 2-8 | J-8 | 400/60 | A | A | A | A |
| Example 2-9 | J-1 | 300/60 | A | A | A | A |
| Example 2-10 | J-9 | 400/60 | A | A | A | A |
| Example 2-11 | J-10 | 400/60 | A | A | A | A |
| Example 2-12 | J-11 | 400/60 | A | A | A | A |
| Example 2-13 | J-12 | 400/60 | A | A | A | A |
| Example 2-14 | J-13 | 400/60 | A | A | A | A |
| Comparative Example 2-1 | j-1 | 300/60 | A | — | C | C |
| Comparative Example 2-2 | j-2 | 400/60 | A | C | C | B |
| Comparative Example 2-3 | j-3 | 300/60 | A | C | C | C | wherein in the formula (2-1):

Z represents a partial structure represented by formula (1);

$R^B$ represents a group obtained by removing m hydrogen atoms from a substituted or unsubstituted arene having 6 to 20 carbon atoms, the arene being benzene, naphthalene, anthracene, phenanthrene, tetracene, pyrene, triphenylene, or perylene, or a group obtained by removing m hydrogen atoms from a substituted or unsubstituted heteroarene having 5 to 20 ring atoms, the heteroarene being pyridine, pyrazine, pyrimidine, pyridazine, triazine, quinoline, isoquinoline, quinazoline, cinnoline, phthalazine, quinoxaline, pyrrole, indole, furan, benzofuran, thiophene, benzothiophene, pyrazole, imidazole, benzimidazole, triazole, oxazole, benzoxazole, thiazole, benzothiazole, isothiazole, benzisothiazole, thiadiazole, isoxazole, or benzisoxazole; and m is an integer of 2 to 20, wherein in a case in which m is no less than 2, a plurality of Zs are identical or different,

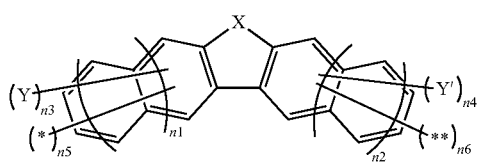

(1)

wherein, in the formula (1):

X represents a group represented by formula (i), (ii), (iii) or (iv);

n1 and n2 are each independently an integer of 0 to 2;

Y and Y' each independently represent a monovalent organic group having 1 to 20 carbon atoms;

n3 and n4 are each independently an integer of 0 to 8;

* and ** each denote a bonding site to $R^B$ in the formula (2-1); and n5 is 1 and n6 is 0, or n5 is 0 and n6 is 1, wherein in a case in which n3 is no less than 2, a plurality of Ys are identical or different, and in a case in which n4 is no less than 2, a plurality of Y's are identical or different, and wherein n3+n5 is no greater than 8, and n4+n6 is no greater than 8,

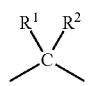 (i)

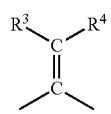 (ii)

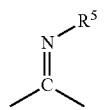 (iii)

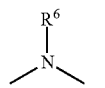 (iv)

wherein, in the formula (i): $R^1$ and $R^2$ each independently represent a hydrogen atom, a hydroxy group, a substituted or unsubstituted monovalent aliphatic hydrocarbon group having 1 to 20 carbon atoms, or a substituted or unsubstituted aralkyl group having 7 to 20 carbon atoms provided that at least one of $R^1$ and $R^2$ represents the substituted or unsubstituted monovalent aliphatic hydrocarbon group having 1 to 20 carbon atoms or the substituted or unsubstituted aralkyl group having 7 to 20 carbon atoms; or $R^1$ and $R^2$ taken together represent a part of a ring structure having 3 to 20 ring atoms together with the carbon atom to which $R^1$ and $R^2$ bond, in the formula (ii): $R^3$ and $R^4$ each independently represent a hydrogen atom, a hydroxy group or a monovalent organic group having 1 to 20 carbon atoms; or $R^3$ and $R^4$ taken together represent a part of a ring structure having 3 to 20 ring atoms together with the carbon atom to which $R^3$ and $R^4$ bond, in the formula (iii), $R^5$ represents a hydrogen atom, a hydroxy group or a monovalent organic group having 1 to 20 carbon atoms, and in the formula (iv), $R^6$ represents a substituted or unsubstituted monovalent aliphatic hydrocarbon group, or a substituted or unsubstituted aralkyl group having 7 to 20 carbon atoms.

2. The patterned substrate production method according to claim 1, wherein, in the formula (i): $R^1$ and $R^2$ each independently represent a hydrogen atom, a substituted or unsubstituted monovalent aliphatic hydrocarbon group having 1 to 20 carbon atoms, or a substituted or unsubstituted aralkyl group having 7 to 20 carbon atoms; or $R^1$ and $R^2$ taken together represent a part of a ring structure having 3 to 20 ring atoms together with the carbon atom to which $R^1$ and $R^2$ bond.

3. The patterned substrate production method according to claim 1, wherein the composition for resist underlayer film formation further comprises a crosslinkable compound other than the compound represented by the formula (2-1).

4. The patterned substrate production method according to claim 1, wherein in the formula (2-1), m is an integer of 3 to 6.

5. The patterned substrate production method according to claim 1, wherein in the formula (2-1), m is an integer of 3.

6. The patterned substrate production method according to claim 1, wherein in the formula (1), n1 is 0, and n2 is 0.

7. The patterned substrate production method according to claim 1, wherein $R^B$ represents a group obtained by removing m hydrogen atoms from a substituted or unsubstituted arene having 6 to 20 carbon atoms, and the arene is benzene or naphthalene.

8. The patterned substrate production method according to claim 1, wherein $R^B$ represents a group obtained by removing m hydrogen atoms from a substituted or unsubstituted arene having 6 to 20 carbon atoms, and the arene is benzene.

9. The patterned substrate production method according to claim 1, wherein $R^B$ represents a group obtained by removing m hydrogen atoms from a substituted or unsubstituted heteroarene having 5 to 20 ring atoms, and the heteroarene is triazine.

10. The patterned substrate production method according to claim 1, wherein a content of the compound represented by the formula (2-1) with respect to a total solid content in the composition for resist underlayer film formation is from 70% to 100% by mass.

11. The patterned substrate production method according to claim 1, wherein a content of the compound represented by the formula (2-1) with respect to a total solid content in the composition for resist underlayer film formation is from 85% to 100% by mass.

12. The patterned substrate production method according to claim 1, wherein a content of the compound represented by the formula (2-1) in the composition for resist underlayer film formation is from 1% to 50% by mass.

13. The patterned substrate production method according to claim 1, wherein a content of the compound represented by the formula (2-1) in the composition for resist underlayer film formation is from 3% to 30% by mass.

14. The patterned substrate production method according to claim 1, wherein a content of the compound represented by the formula (2-1) in the composition for resist underlayer film formation is from 5% to 15% by mass.

15. The patterned substrate production method according to claim 1, wherein the solvent is at least one selected from the group consisting of an alcohol solvent, a ketone solvent, an ether solvent, an ester solvent, and a nitrogen-containing solvent.

16. The patterned substrate production method according to claim 1, wherein the composition for resist underlayer film formation further comprises an acid generating agent.

17. The patterned substrate production method according to claim 16, an amount of the acid generating agent in the composition for resist underlayer film formation is 3 to 10 parts by mass with respect to 100 parts by mass of the compound represented by the formula (2-1).

\* \* \* \* \*